United States Patent [19]

Harris et al.

[11] Patent Number: 4,862,072
[45] Date of Patent: Aug. 29, 1989

[54] DISTRIBUTED ACCESS SERIAL PORT TEST ARRANGEMENT FOR INTEGRATED CIRCUITS

[75] Inventors: John W. Harris, Mt. Laurel Township, Burlington County; Jon L. Sherling, West Ampton Township, Burlington County; Carl N. Puschak, Mt. Laurel Township, Burlington County all of N.J.

[73] Assignee: General Electric Company, Morrestown, N.J.

[21] Appl. No.: 241,742

[22] Filed: Sep. 8, 1988

[51] Int. Cl.$^4$ .............................................. G01R 31/28
[52] U.S. Cl. ..................................... 324/73 R; 371/25
[58] Field of Search ........... 324/73 R, 73 AT, 73 PC; 71/15, 20, 25

[56] References Cited

U.S. PATENT DOCUMENTS

| | | | |
|---|---|---|---|
| 4,710,931 | 12/1987 | Bellay et al. | 371/25 |
| 4,710,933 | 12/1987 | Powell et al. | 324/73 R |
| 4,754,215 | 6/1988 | Kawai | 324/73 R |
| 4,760,335 | 7/1988 | Lindberg | 324/158 F |
| 4,791,358 | 12/1988 | Sauerwald et al. | 324/73 R |

Primary Examiner—Ernest F. Karlsen
Attorney, Agent, or Firm—William H. Meise

[57] ABSTRACT

A dedicated set of four input pads or pins of an LSI chip provides access by a serial data line to macrocells or other partoned logic of the LSI for individual test. A macrocell is connected to the remainder of the logic by a pair of multiplexer/test register combinations, one at the input, and one at the output of the macrocell. In a normal operation mode, the multiplexers connect each macrocell to the next, for normal signal flow. Under control of test signals, the test registers may be selectively loaded with data from the serial data bus, and the multiplexers may be switched to apply test data from the test register to a macrocell. The output multiplexer of the macrocell routes the resulting processed test data to the output test register, so it may be read out in serial form while normal operation resumes.

7 Claims, 17 Drawing Sheets

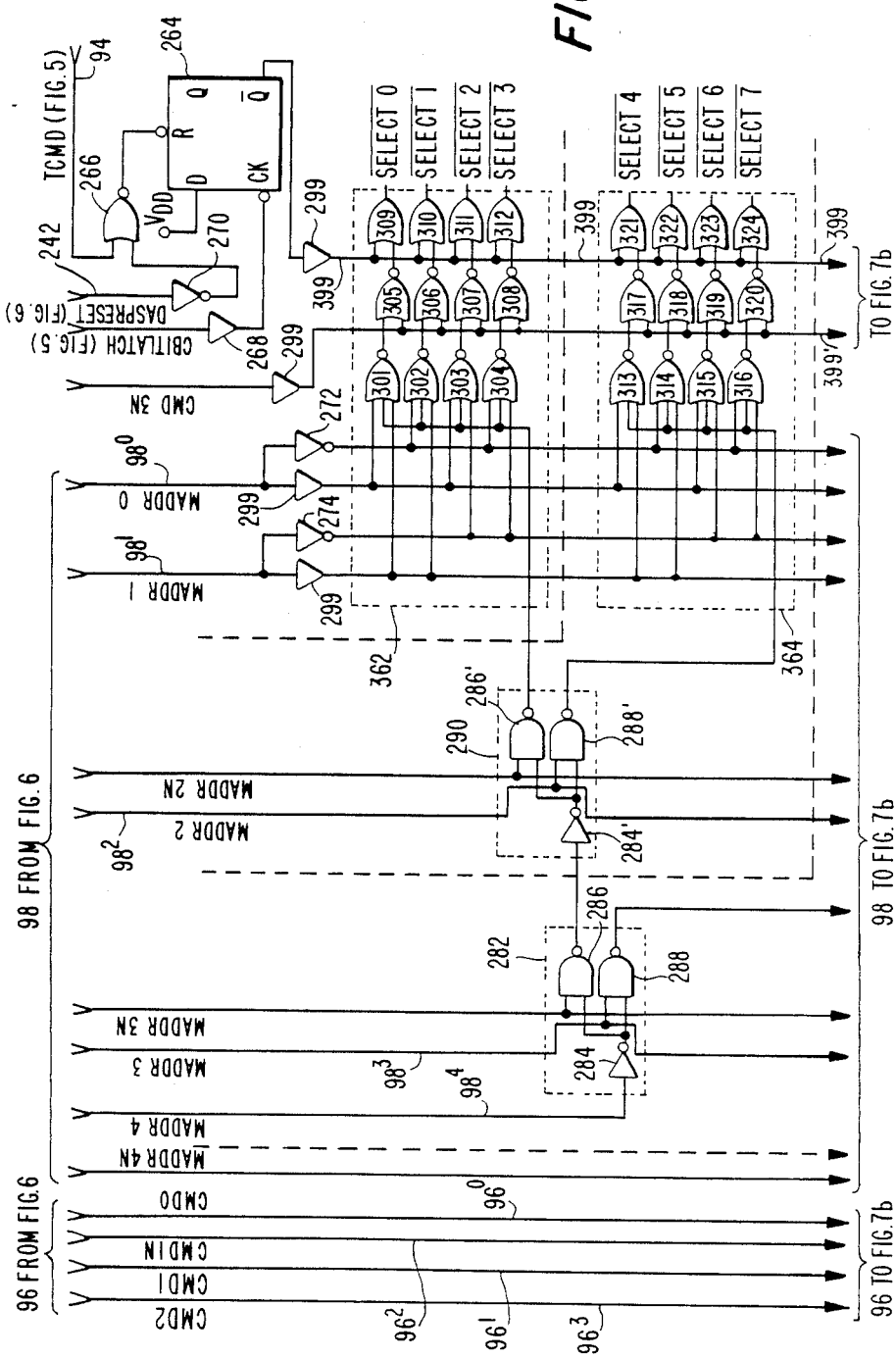

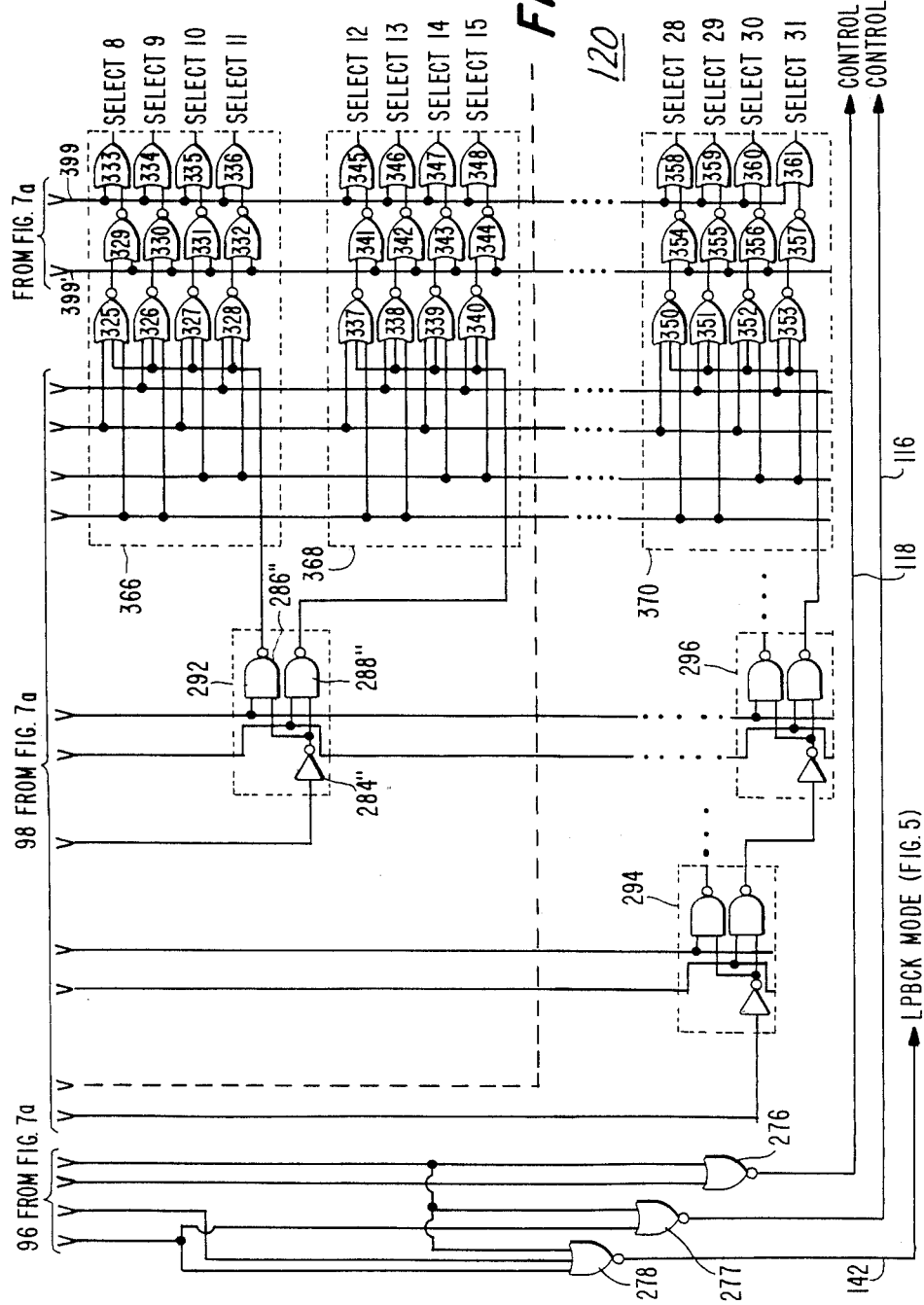

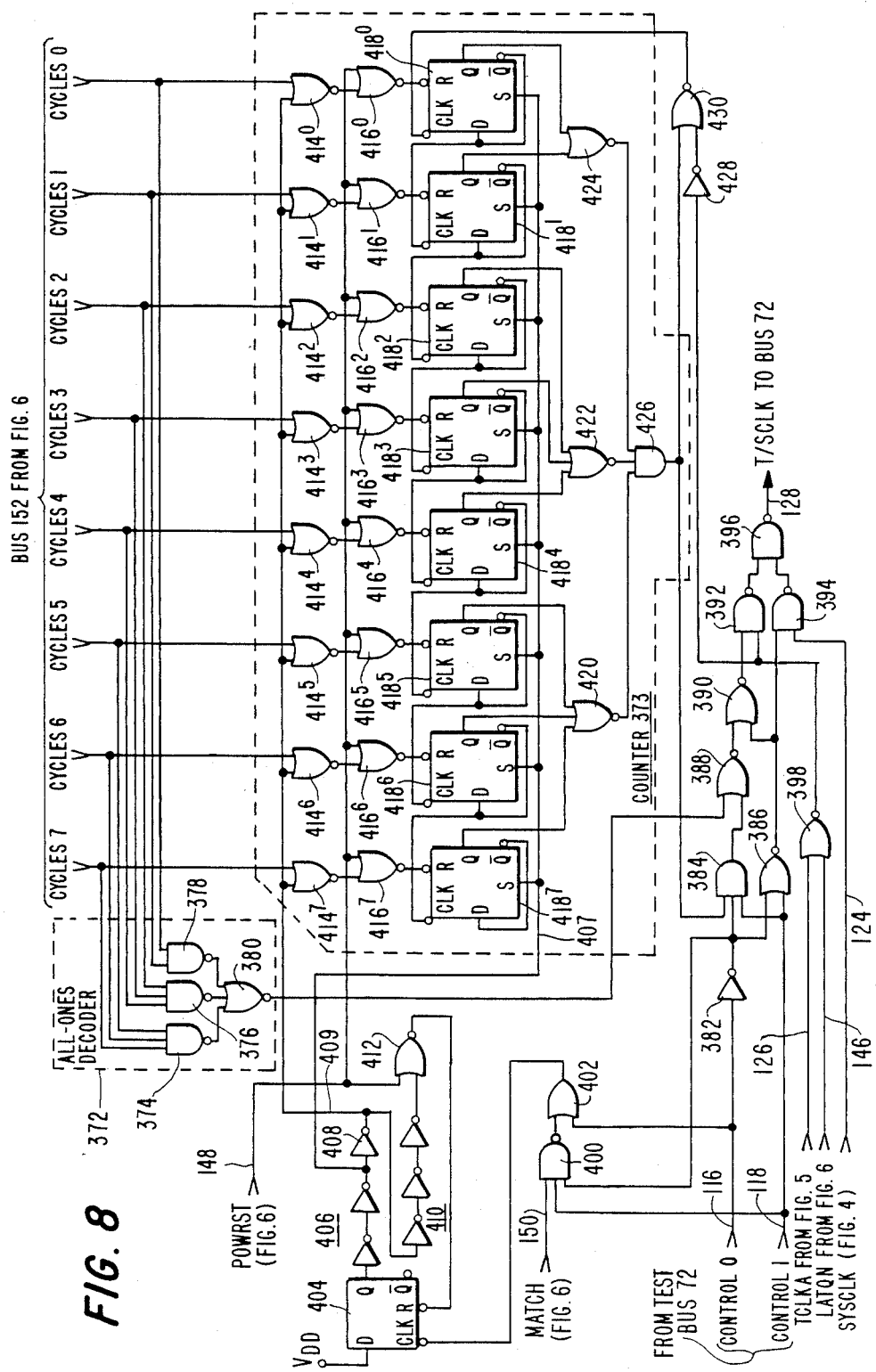

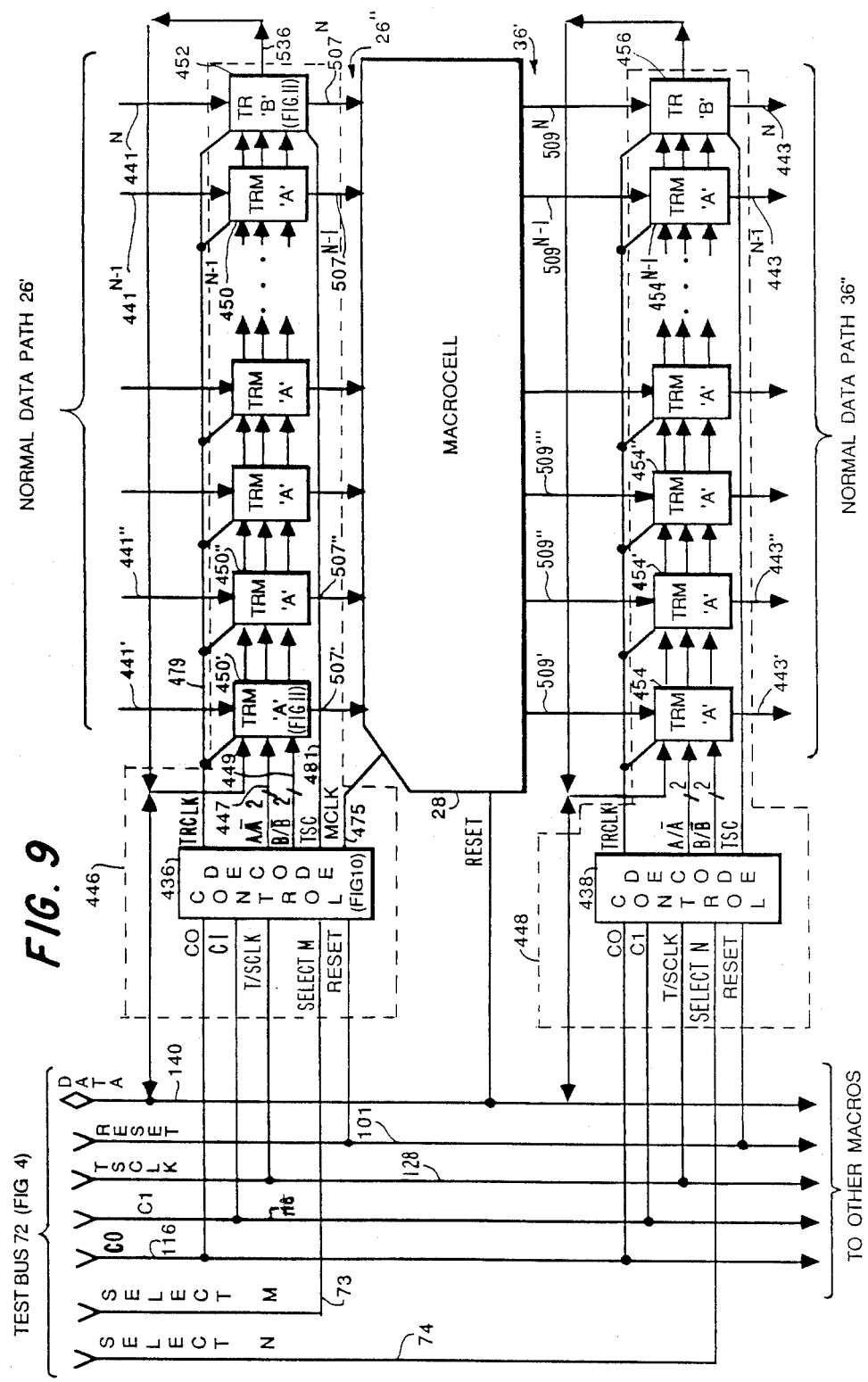

ONE-BIT TEST REGISTER AND MULTIPLEXER 450,452

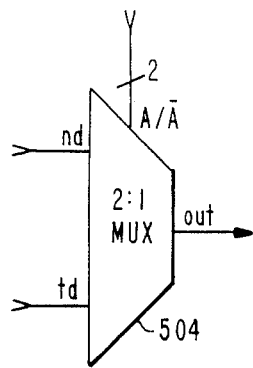
FIG. 12a
| A | nd | td | out |
|---|----|----|----|
| 0 | 0 | X | 0 |
| 0 | 0 | X | 0 |
| 0 | 1 | X | 1 |
| 0 | 1 | X | 1 |
| 1 | X | 0 | 0 |
| 1 | X | 1 | 1 |
| 1 | X | 0 | 0 |
| 1 | X | 1 | 1 |
FIG. 12c
FIG. 12b
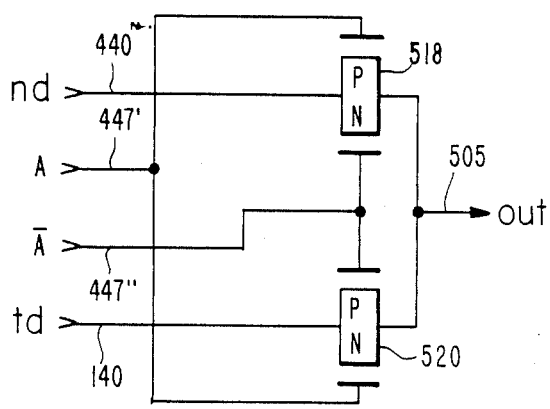

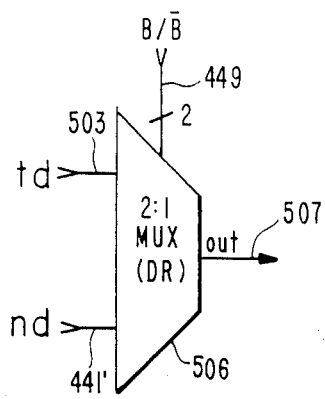
FIG. 13a
| B | nd | td | out |
|---|----|----|-----|
| 0 | 0  | X  | 0   |
| 0 | 0  | X  | 0   |
| 0 | 1  | X  | 1   |
| 0 | 1  | X  | 1   |
| 1 | X  | 0  | 0   |
| 1 | X  | 1  | 1   |
| 1 | X  | 0  | 0   |
| 1 | X  | 1  | 1   |
FIG. 13c
FIG. 13b
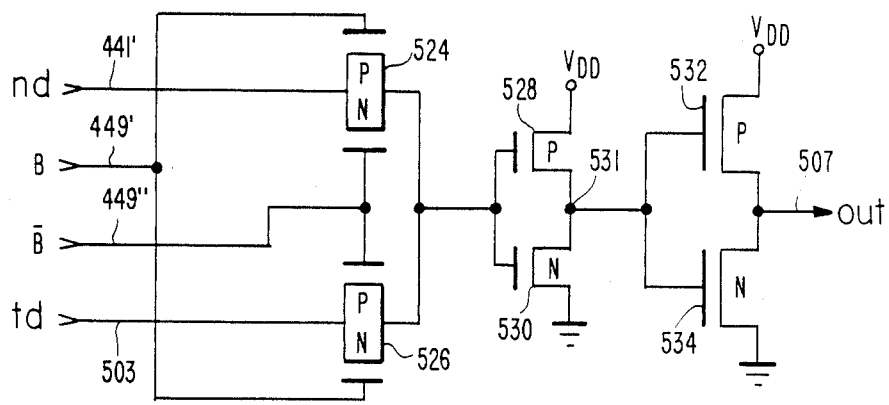

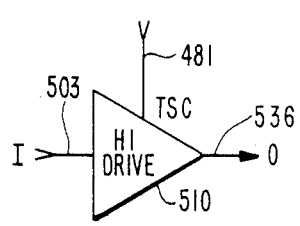
FIG. 14a
| TSC | I | O |
|-----|---|---|
| 0 | X | Z |
| 0 | X | Z |
| 1 | 0 | 0 |
| 1 | 1 | 1 |
FIG. 14c
FIG. 14b
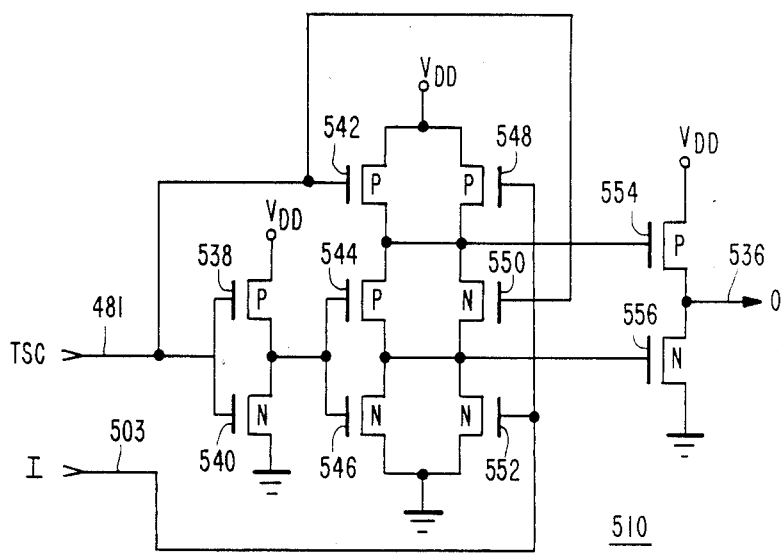

| MODE | (CMD) | C1 | C0 |
|---|---|---|---|
| NORMAL ALL (SOFT RESET) | 0000 | 0 | 1 |
| NORMAL INDIVIDUAL | 1000 | 0 | 1 |
| FREEZE ALL | 0001 | 0 | 0 |
| FREEZE INDIVIDUAL | 1001 | 0 | 0 |
| READ | 0010 | 1 | 1 |
| READ | 1010 | 1 | 1 |
| WRITE ALL | 0011 | 0 | 0 |
| WRITE | 1011 | 0 | 0 |
| SPARE | 0100 | 0 | 0 |
| SPARE | 1100 | 0 | 0 |
| SPARE | 0101 | 0 | 0 |
| SPARE | 1101 | 0 | 0 |
| TEST ALL | 0110 | 1 | 0 |
| TEST INDIVIDUAL | 1110 | 1 | 0 |
| LOOP BACK | 0111 | 0 | 0 |
| SPARE | 1111 | 0 | 0 |

| SELECT | CONTROL 1 | CONTROL 0 | MODE |
|---|---|---|---|
| YES | 0 | 0 | FREEZE/WRITE |
| YES | 0 | 1 | NORMAL OPERATION |
| YES | 1 | 0 | TEST |
| YES | 1 | 1 | READ |
| NO | X | X | NO CHANGE IN MACROCELL |

DISTRIBUTED ACCESS SERIAL PORT TEST ARRANGEMENT FOR INTEGRATED CIRCUITS

This invention relates to a standardized four-pin access port for large-scale VLSI.

Reliability in electronic systems is enhanced by the integration of circuit elements into a single monolithic semiconductor circuit rather than by the use of individual discrete components. Integrated circuits have grown in size and complexity over the years, and each integrated circuit at the current state of the art may include more than one quarter million transistors. As the number of transistors in the integrated circuit increases, the yield of chips decreases as a result of defects in the integrated circuit base material and in the processing. The increasing complexity of integrated circuits has increased the difficulty of testing the integrated circuits after fabrication to detect imperfect units.

The difficulties in testing may be understood by considering the problem of testing a 16-bit ×16bit multiplier. To completely test such a multiplier, each of about 65,000 different combinations of bits must be applied to one input for each of the 65,000 combinations of bits applied to the other input, which represents over four billion combinations, and for each of those combinations the corresponding output signal must be checked. When, however, a system includes cascades of similarly complex circuits, the applied signal combinations must pass through many processing stages. A cascade for this purpose means that at least a portion of the output of one circuit is coupled to another circuit to serve as at least a portion of its input. The number of possible input permutations of a very large scale integrated (VLSI) circuit or LSI circuit including cascades of complex subcircuits with additional inputs presents extreme problems not only in the length of time required to actually generate the signals by means of a test apparatus and for comparing the actual output with the correct output, but it also presents extreme problems in devising the test strategy. For example, a designer may be required to perform complex system analysis to determine the most effective test strategy for a particular chip, and then further work for programming the testing apparatus itself. The cost of such tests may be a significant portion of the total cost of the chip; complete testing is prohibitively expensive.

Testing costs may be reduced by performing tests for only a fraction of the chips produced or, for those chips which are tested, performing only some, but not all possible tests. However, in certain applications stringent test regimens are required to guarantee reliability and performance of communication, control and hazardous systems. Similarly stringent safety requirements may require exhaustive testing of integrated circuits used for commercial vehicles such as aircraft. Even if safety is not a paramount consideration, as for example in the case of integrated circuits used for engine control in automobiles, exhaustive testing may be desired at the time the chip is produced in order to avoid financial disaster attributable to after-sale warranty repair costs.

Many modern communication and control circuits are so complex that they may use many interconnected VLSI integrated circuits. Such large systems are often used in important applications, as for example bank financial records, telephone central switching control, and like. Since integrated circuits do occasionally fail after installation, it would be highly desirable to be able to perform tests on such a large scale system in an effective manner in order to localize a problem to a particular integrated circuit. One may appreciate, however, that a complex system involving many LSI integrated circuits presents a formidable trouble-shooting analysis problem. In such a system, if each chip must be tested for each of billions of possible signal permutations, the usefulness of the test may be reduced. A simple standardized method of testing which can be performed on an integrated circuit chip at the time of manufacture and after integration into a system is desirable. The system should be amenable to the possibility of changes in the test regimen after the design is completed, and should be simple to implement during design of any LSI chip.

SUMMARY OF THE INVENTION

According to an aspect of the invention, an LSI monolithic semiconductor integrated circuit is adapted for processing signals received over a large number of input pads and for cascading the signals so processed through a plurality of processing blocks to a large number of output pads. A dedicated test port of four additional pads is adapted to be coupled to a test apparatus external to the semiconductor circuit. The four pads include a test data pad adapted for receiving serial test information from the test apparatus in one mode of operation and, in another mode of operation, for transmitting serial test response data to the test apparatus. Another of the four pads of the test port includes a test data direction pad adapted for receiving a test data direction signal from the external test apparatus for controlling the direction of the serial test information on the test data pad. A test clock pad is also included for receiving test clock signals from the test apparatus. The fourth test port pad is for defining whether command or test data information is being received from the test apparatus. The processing of signals by the integrated circuit is partitioned into signal processing blocks, and a controllable test register and multiplexing arrangement is connected between the partitioned signal processing blocks for, in a normal operating mode, allowing signals to be processed from one signal processing block to the next in the intended manner. In a test mode of operation, the test registers at the input of a selected signal processing block may be loaded with a serial test pattern under control of the test data direction and test command signals from the test apparatus. The controllable multiplexers may also be switched so as to effectively disconnect the particular signal processing block from the normal operating signals, and to instead receive signals from the test register preloaded with test data, and for directing the output of the signal processing block being tested to a test register coupled to its output. Under further control of the external test apparatus, the test register at the output of the signal processing block being tested may be read to compare the actual output of the signal processing block with the expected output.

DESCRIPTION OF THE DRAWING

FIGS. 7a and 7b together are a logic diagram of a command and address decoder portion of the arrangement of FIG. 5;

FIG. 8 is a logic diagram of a clock control portion of the arrangement of FIG. 5;

FIG. 9 illustrates in more detailed block diagram form the test registers and multiplexers associated with one signal processing block of the arrangement of FIG. 3;

FIG. 12a illustrates the schematic symbol of a 2:1 multiplexer of FIG. 11, FIG. 12a is a schematic representation thereof, and FIG. 12c is its truth table, FIGS. 12a, 12b and 12c are together referred to as FIG. 12;

FIG. 13a the symbol for a high drive (DR) 2:1 multiplexer of FIG. 11, FIG. 13b is a schematic diagram thereof and FIG. 13c is its truth table, FIGS. 13a, 13b and 13c together are referred to as FIG. 13;

FIG. 14a illustrates the symbol of a tristate driver of FIG. 11, FIG. 14b is a schematic diagram thereof, and FIG. 14c is its truth table;

FIG. 15a is a tabulation of system operating modes, and the state of certain command signals in an arrangement according to the invention, and FIG. 15b is a tabulation of test register operating modes;

DESCRIPTION OF THE INVENTION

Figure 1:
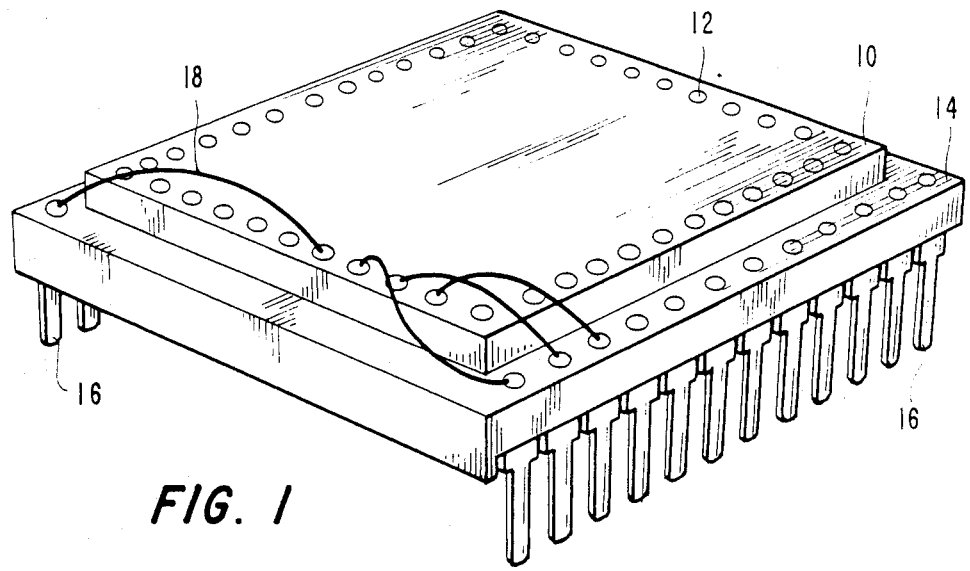
FIG. 1 is a perspective or isometric view of an integrated circuit including connection pads connected to the pins of an IC carrier.

FIG. 1 illustrates a semiconductor integrated circuit chip 10 including a plurality of connection pads, one of which is illustrated as 12, located adjacent peripheries of chip 10. Integrated circuit 10 is mounted on a chip carrier 14 to which are attached a number of connection pins, one of which is designated 16. Various bonding wires, only some of which are illustrated, and one of which is designated 18, connect each of connection pads 12 to ends of one of pins 16.

Figure 2:
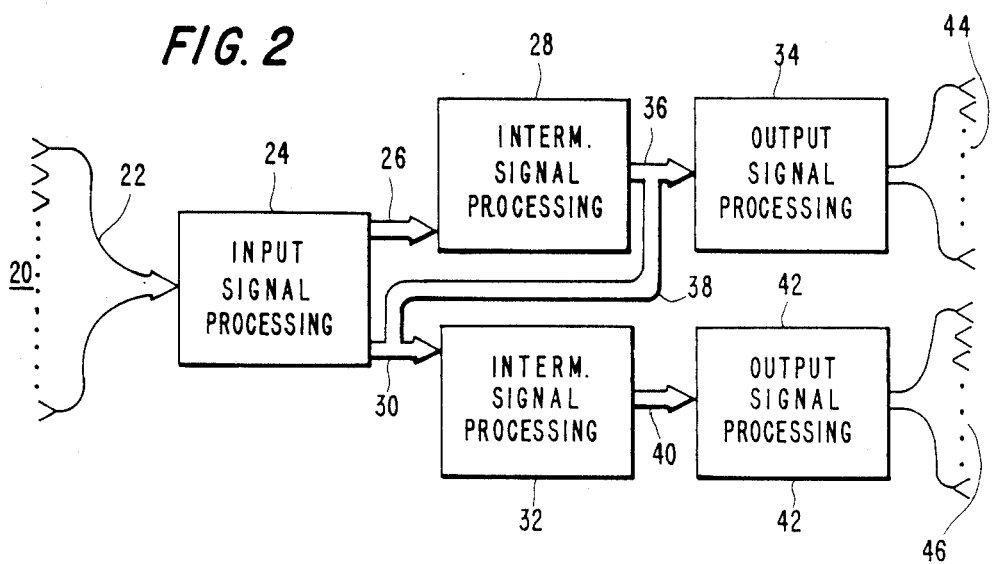
FIG. 2 is a block diagram illustrating cascaded signal processing blocks which may represent the signal processing performed by the integrated circuit of FIG. 1.

FIG. 2 illustrates in general block diagram form the circuits which may be formed monolithically within integrated circuit 10. As illustrated in FIG. 2, a number of input terminals designated jointly at 20 at the left of the FIG. are connected by parallel conductors 22 to a first signal processing block 24. The term parallel as known to those skilled in the art means that various bits of an information signal are produced and transmitted essentially simultaneously on a set of plural conductors, as contrasted with serial data, in which the bits of an information signal are transmitted sequentially over a single conductor. Terminals 20 correspond to a subset of the plurality of pins 16 of FIG. 1. Output terminals 44 and 46, at the right of FIG. 2, constitute another subset of pairs 16 of FIG. 1. Other pins 16 of FIG. 1 provide power and ground connections and possibly other functions, not illustrated in FIG. 2.

Input signal processing block 24 as illustrated in FIG. 2 produces processed signals on a set 26 of parallel conductors which is applied to an intermediate processing block 28. A further portion of the processed output signals of signal processing block 24 are generated as parallel data and applied over a conductor set 30 to a further signal processing block 32. Second processed signals exiting from signal processing block 28 are applied in part to an output signal processing block 34 by way of a conductor set 36, and a portion of the bits of the second processed signals are applied over a conductor set 38 to join with conductor set 30 for application to signal processing block 32. Signal processing block 32 further applies parallel data over a conductor set 40 to an output signal processing block 42. Parallel data or signals at the output of signal processing block 34 are applied to set 44 of output terminals, and the output data from signal processing block 42 is applied to set 46 of output terminals.

The signal processing blocks of FIG. 2 may represent suitable conceptual breakdown of the circuitry. One subdivision which may often be used as a single signal processing block is a macrocell, which is a predesigned logic circuit which is incorporated into integrated circuit 10. A macrocell may be, for example, a counter, a shift register, a ROM OR RAM, a multiplier, an arithmetic unit or the like.

It may be appreciated that where blocks 24, 28 and 34 are complex signal processing blocks such as the aforementioned 16×16 multiplier, lengthy and extensive tests may be required to establish the functionality of each possible state which it may assume, and this problem may be made even more severe if memories are included in any of the signal processing blocks such as 24 28, 32, thereby making the output signal at terminals 44 depend upon the preceding signal values or upon the sequence of application of the signals leading up to the particular output signal. This means that not only must all possible permutation of input signals be applied, but they must be applied in all possible orders. A yet further problem arises when paths such as path 38 is included.

Figure 3:
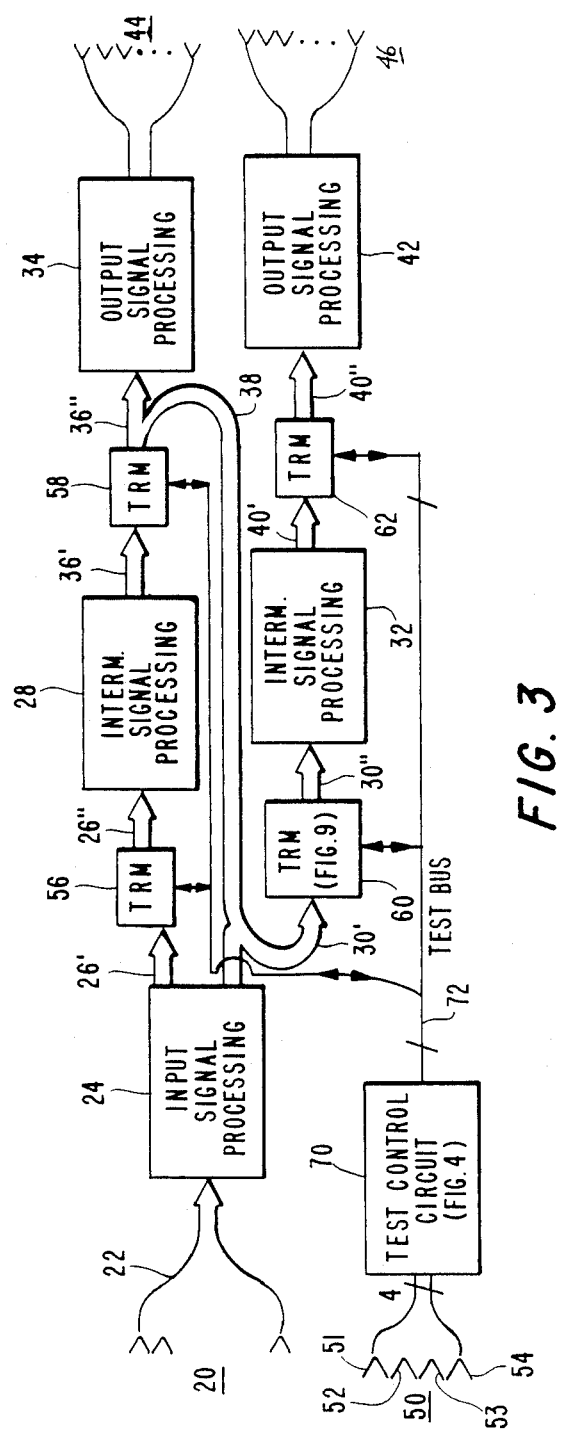
FIG. 3 illustrates in block diagram form the signal processing of FIG. 2 partitioned in accordance with the invention and an overall block diagram of a test arrangement to the invention.

FIG. 3 illustrates the signal processing of the arrangement of FIG. 2 modified in accordance with the invention. In FIG. 3, elements corresponding to those of FIG. 2 are designated by the same reference numerals. In FIG. 3, the path 26 illustrated in FIG. 2 between signal processing block 24 and signal processing block 28 is broken into two paths 26' and 26'', and a test register and multiplexer (TRM) is coupled in-line between the two paths. A similar test register and multiplexer (TRM) 58 is coupled between separated paths 36' and 36'' of conductor set 36. A further TRM 60 is coupled between portions 30''' and 30'' of conductor 30, and a TRM 62 is coupled between portions 40' and 40'' of conductor set 40. Each test register and multiplexer 56-62 is coupled to a test control circuit illustrated as a block 70 by way of a portion of a multiconductor line or bus 72. Test control circuit 70 is controlled by test signals applied to four test pads 51, 52, 53 and 54, which together are designated as test pads 50.

In general, as described below, the test signals applied to test pads 50 from the external test apparatus (not illustrated) include an identification of the signal processing block or blocks which are to be tested, and also includes a serial test word with which the selected test registers of the TRMs 56–62 are to be loaded. Test control circuit 70 generates the signals required to address and transmit the test signals to the affected TRMs, and the TRMs respond by receiving and temporarily storing the serial test word originating at the external test apparatus. A multiplexer substitutes the test word stored in the test register for the normal data path signal applied to the input of a signal processing block, and stores in the test register of the next TRM downstream from the signal processing block the result of processing in the signal processing block of the test signal. The multiplexer then switches over to a mode in which normal signals are allowed to flow through the affected signal processing block, and the results of the processing of the test signal as stored in the downstream test register may be read from the TRM and transmitted in serial form to the external test apparatus. Thus, the external test apparatus may access each portion or processing block of the integrated circuit. Each position or partitioned block is selected to be small enough for effective test.

As also described below, other test modes are also provided by the test arrangement including test control circuit 70 and TRMs 56–62. It should be noted that the use of externally generated serial test data allows the test word to assume any form desirable in view of the type of failure which is observed. The accumulation of the serial test word in the test registers of the TRM blocks, which test word is then used in parallel form for test of the signal processing blocks, has the very great advantage that the test signal path itself within the IC (as opposed to additional paths which may be required for control of the TRM's) is a single conductor, which substantially simplifies the layout of the integrated circuit, and reduces its overall size. As described in U.S. Pat. Application Ser. No. 065,998 filed June 24, 1987 now U.S. Pat. No. 4,811,237 in the name of Putatunda et al. the layout of signal and power conductors in an integrated circuit affects the overall size of the integrated circuit. This in turn has a great effect on the yield.

Figure 4:
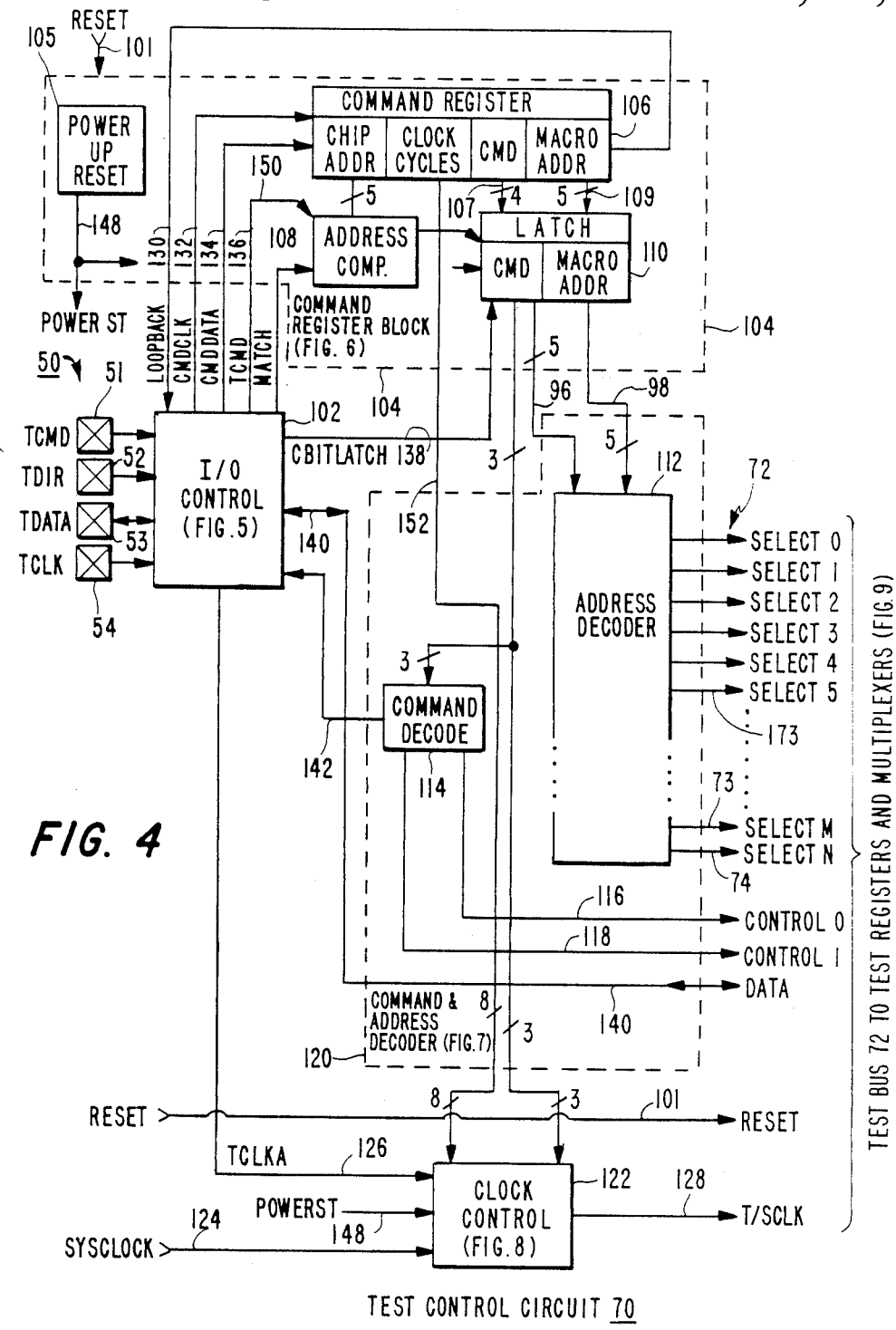
FIG. 4 illustrates in block diagram form the four-pin test port and the test control portion of the test arrangement according to the invention.

FIG. 4 is a general block diagram of test control circuit 70 of FIG. 3. Elements of FIG. 4 corresponding to elements of FIG. 3 are designated by the same reference numerals. In FIG. 4, test pads 51, 52, 53 and 54 are connected to an input-output (I/O) control circuit 102. Test pad 51 is adapted for receiving a test command signal TCMD from the external test apparatus (not illustrated). Test pad 52 is adapted for receiving a test direction signal (TDIR) which controls the direction in which data flows on the test data (TDATA) pad 53. A fourth pad 54 is adapted for receiving test clock (TCLK) signals from the external test apparatus.

I/O control circuit 102 includes combinatorial logic for generating various control signals in response to signals applied to test pads 50 from the external test apparatus (not illustrated) for controlling the direction and the routing of test words, and for controlling the overall operation of the test portion of integrated circuit chip 10 (FIG. 1).

In certain modes of operation, the test signals applied by way of test pads 50 to I/O control 102 comprise test information including the address of the chip for which the test signals are intended. This allows individual test of a particular integrated circuit of a system which includes many integrated circuits. The test signals applied to test pads 50 may also include the address of the signal processing block or macro within the addressed chip for which the test signal is particularly intended, additional commands, and bits representative of the number of clock cycles over which the signal processing block or macrocell to which the test signals are directed is to be operated. For simplicity, it is hereafter assumed that the signal processing block is a macrocell or "macro A command register block 104 is connected to I/O control 102 by conductors or conductor sets 130, 132, 134, 136 and 150 for receiving and storing in a command register 106 the addresses, commands and clock cycles, and for comparing the stored chip address with a hardwired address in an address comparator 108. In response to the correct chip address, the macro address and the commands stored in command register 106 are applied by conductor sets 107 and 109 to latching circuit 110, and are latched by latching circuit 110.

A command and address decoder block 120 includes an address decoder 112 which receives macro addresses and various commands from latch 110 for generating commands for selection control of the various test register and multiplexers (TRMs) 56–62 (FIG. 3) by way of individual SELECT conductors of test bus 72, the SELECT M and SELECT N components of which are designated 73 and 74. Command and address decoder block 120 also includes a command decoder 114 which receives latched commands from latch 110 and generates control signals on a CONTROL 0 conductor 116 and a CONTROL 1 conductor 118, both of which are coupled by Way of test bus 72 to all of the TRMs 56–62 (FlG. 3).

Also illustrated in FIG. 4 is a clock control circuit 122 which receives system clock (i.e., normal operation clock) (SYSCLOCK) from the external system over a conductor 124 and test clock signals (TCLKA) from I/O control 102 over a conductor 126 for, under control of clock cycles bit commands latched in latch 110, coupling either system clock or test clock over a T/SCLK conductor 128 (part of test bus 72) to the test registers and multiplexers TRM 56–62 (FIG. 3). In one mode of test operation, the number of cycles of test clock TCLKA coupled to T/SCLK conductor 128 is predetermined.

Figure 5:
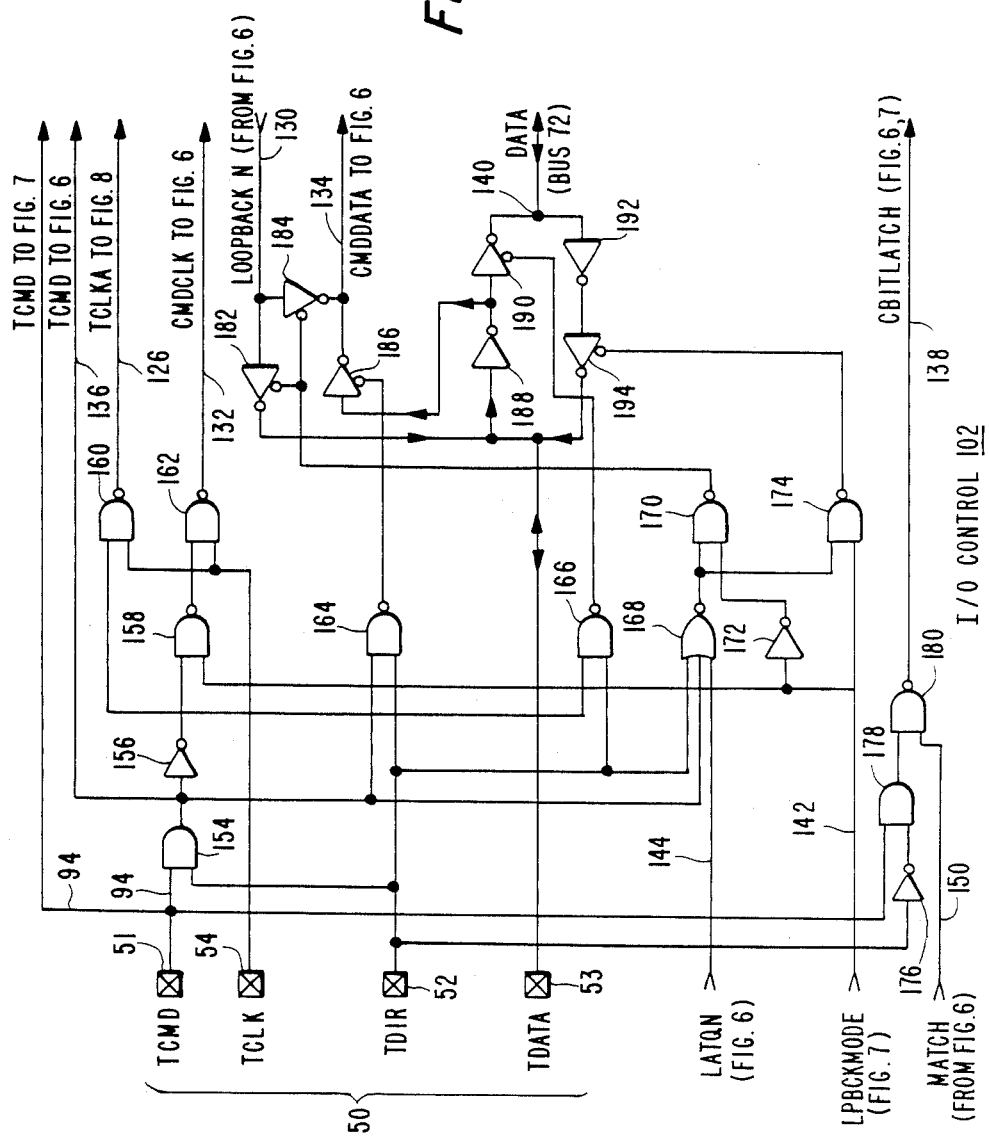
FIG. 5 illustrates in logic diagram form the input-output (I/O) portion of the test control circuit of FIG. 4.

FIG. 5 is a logic diagram of I/O control 102 of 0 FIG. 4. In FIG. 5, elements corresponding to those of FIG. 4 are designated by the same reference numerals. In FIG. 5, test data (TDATA) applied to pad 53 from an external test apparatus, not illustrated, is applied to the input of an inverting amplifier 188 in one mode of operation. In another mode of operation, the external test apparatus receives data from the output of a tri-state driver 194 or a tri-state driver 182 under control of the test signals applied to test pads 51, 52 and 54. During those conditions in which TDATA is applied to pad 53 from the external source, the TDATA at the output of driver 188 may flow through a controllable driver 186 to a conductor 134 in the form of command data (CMDDATA). In another operating condition, the TDATA signals at the output of driver 188 may pass through a controllable driver 190 to a DATA conductor 140, which is part of test bus 72 which, as described in conjunction with FIG. 3, is connected within the integrated circuit to all the test register and multiplex circuits associated with the various macros. Data returning from conductor 140 of bus 72 passes through a driver 192 and further controllable driver 194 to test pad 53, where it becomes available to the external test apparatus. The high output impedance condition of tri-state drivers 182 and 194 prevents conflicts with test information intended for other chips or semiconductor integrated circuits which happen to be connected to TDATA pad 53. As described below, each test command included within the test information applied to pad 53 may include a chip address which is recognized by comparison with an internal chip memory.

The logic state of the test signal applied to TDIR pad 52 determines the direction of the bidirectional tri-state serial test data line connected to test pad 53. Test direction pad 52 is connected to inputs of each of an AND gate 154, a NAND gate 164, and (by way of an inverter 176) an AND gate 178. When the external test apparatus sets TDIR pin 52 to a logic high or logic one level, TDATA pad 53 is configured as an input to integrated circuit 10 (FIG. 1), and conversely when TDIR pad 52 is at a logic 0 level, TDATA pad 53 is configured as an output pad of IC 10.

Test command (TCMD) pad 51 is connected by a conductor 94 to the input of an AND gate 154 and to another input of an AND gate 178. When the directional information signal applied from the external test apparatus to TDIR pad 52 is logic low, thereby configuring TDATA pad 53 as an output, inverter 176 inverts the logic low and applies a logic high to AND gate 178.

The test signal applied from the external test apparatus to TCMD pad 151 determines the routing of the test information signal applied to TDATA pad 53. In one mode of operation, the data applied to TDATA pad 153 is coupled to stored temporarily in a command register, and in another mode of operation the test data is routed by way of conductor 140 of test bus 72 to all the test register and multiplexers (TRMs).

Transitions of the signals applied to TCMD pad 51 are also used to perform certain control functions. A negative-going transition (logic high to logic low level) applied to TCMD pad 51 while TDIR pad 52 is held at a logic high or logic one level results in a comparison of the internal chip address with a chip address received from the external test apparatus. Also, a negative-going transition on TCMD pad 51 with TDIR pad 52 held at a logic low activates certain control signals, namely "control 0" and "control 1A positive-going pulse (logic low to logic high level) applied to TCMD pad 51 with TDIR pad 52 held at a logic low level latches certain control signals. When TCMD pad 51 is at a logic high, AND gate 178 enables a NAND gate 18 so that in the event of a match of the chip address in the received test signal with the internal address of the chip as represented by a logic high level on a conductor 150, a logic low is produced on CBITLATCH conductor 138 for latching command information temporarily stored in the command register.

When TCMD pad 51 and the TDIR pad 52 of FIG. 5 are both held logic high by the external test apparatus, AND gate 154 is enabled, and produces at its output a logic high level which is applied to the input of an inverter 156, to an input of a NOR gate 168, and to an input of a NAND gate 164. NAND gate 164 responds to the logic high levels at its inputs by producing a logic low level for application to the control input terminal of transmission gate 186, which is thereby enabled to couple data applied through driver 188 from TDATA pad 53 to command data (CMDDATA) conductor 13 for application to the command register, discussed below in conjunction with FIG. 6. Concurrently therewith, inverter 156 produces a logic low level which is applied to an input of NAND gate 166, together with the logic high level from TDIR pad 52. Gate 166 produces a logic high level for application to transmission gate 190, which disables gate 190, whereby data applied to TDATA pad 53 and though driver 188 is not coupled to data line 140 of bus 170. Thus, with TCMD pad 51 and TDIR pad 152 both held at a logic high level, data applied to TDATA pad 153 is routed to conductor 134 and not to conductor 140 of test bus 72.

Figure 6:
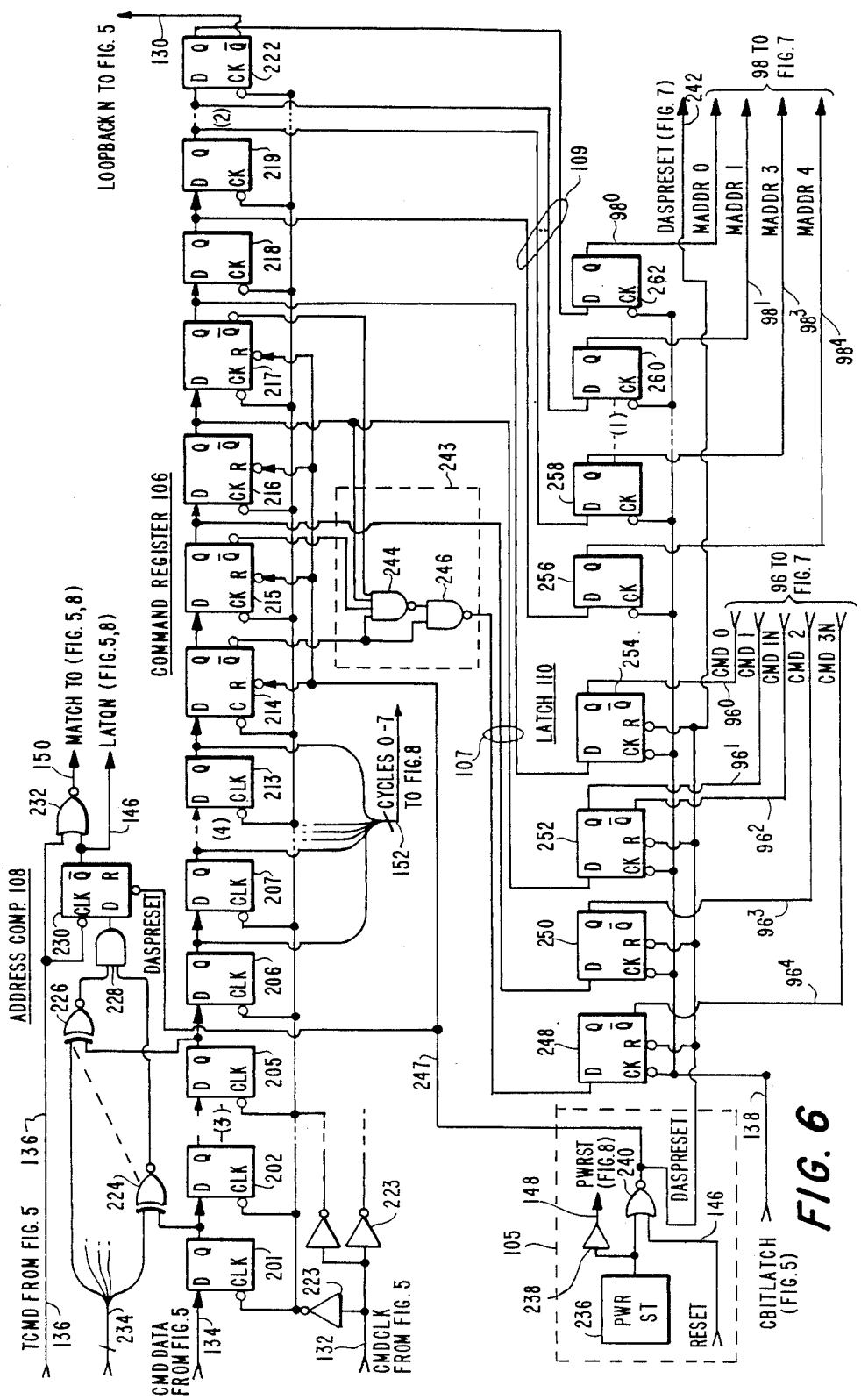
FIG. 6 is a logic diagram of a command register block of the system of FIG. 5.

Test clock (TCLK) signals applied to TCLK pad 54 are used, in one mode of operation, to clock the serial loading of the test data applied to TDATA pad 53 into the command register 106 of FIG. 6. When TCMD pad 51 and TDIR pad 52 are held at a logic high level, a logic low level appears at the output of inverter 156 which is applied to an input of a NAND gate 158.

When in loopback mode, a NOR gate 278 (lower left of FIG. 7) produces on LPBCKMODE conductor 142 (FIG. 5) a logic high level which is applied to an inverter 172 and to another input of NAND gate 158. The logic low level applied to NAND gate 158 from inverter 156 forces the output of NAND gate 158 to a logic high level regardless of the other input. The logic high level produced by NAND gate 158 is applied to an input of a further NAND gate 162 for enablement thereof. In this context, enablement means that the gate output can change state in response to the signal applied to another one of its inputs. The TCLK signal applied to pad 54 is coupled through enabled NAND gate 162 and to command register 106 (FIG. 6) by way of a CMDCLK conductor 132. TCLK signals applied to pad 54 are also applied to a second input of NAND gate 160, but are not coupled therethrough onto conductor 126 because of the logic low level applied thereto from inverter 156, which disables AND gate 160.

Upon the occurrence of each power-up of integrated circuit 10 (FIG. 1) within the described circuits, a power start circuit (PWRST) illustrated as a block 236 (lower left of FIG. 6) produces a transition which is applied to an input of an NOR gate 240 and also to the input of a driver 238 which drives a conductor 148 with a PWRST signal which is used in the clock control arrangement of FIG. 8. NOR gate 240 also receives system reset (RESET) signal over a conductor 146 from one of input terminals 22 (FIG. 2). Upon the occurrence of a power-up or system reset, NOR gate 240 produces a transition on a DISTRIBUTED ACCESS SERIAL PORT RESET (DASPRESET) conductor 242 for resetting a flip-flop 230 (top of FIG. 6), certain stages 214–217 of command register 106 (upper portion of FIG. 6), latches 248–262 of latch 110 (FIG. 6) and, by way of an inverter 270 (FIG. 7) and an NOR gate 266, a FF 264 (FIG. 7).

At upper left of FIG. 6 the TCMD signal is received on conductor 136 from FIG. 5 and is applied to the clock (CLK or CK) input terminal of a type D flip-flop (FF) 230. Gated test information in the form of command data (CMDDATA) is received over conductor 134 from FIG. 5 and is applied to the D input of a D FF 201 of a first stage of a 22-stage command register designated generally as 106. Gated test clock signals TCLK in the form of CMDCLK are received by way of conductor 132 from FIG. 5 and are applied to a number of drivers 223, the outputs of which are connected to the clock (CLK) input terminals of stages 201, 202, 203 ... 222 of command register 106 for clocking on the negative-going transition of the gated TCLK signal CMDCLK, as illustrated by waveform 570 of FIG. 16a at times such as T3, T4, etc. Each negative-going transition of the CMDCLK signal loads or sequentially shifts the command data originating from the external test apparatus into the stages 201-222 of command register 106, with the result that the first data applied from conductor 134 to stage 201 ultimately is shifted into stage 222 at the right of command register 106, when register 106 is fully loaded.

When command register n106 of FIG. 6 is fully loaded, the first five (left) stages 201-205 are loaded with chip address information, the next eight stages 206-213 are loaded with information relating to the number of test cycles which are to be executed during the test, the next four stages 214-217 are loaded with command information, and the last five stages 218-222 are loaded with information relating to the macrocell(s) (or signal processing blocks) which are to be addressed during the test currently being performed.

The chip address information stored in stages 201-205 of command register 106 is coupled from the Q output of each stage to inputs of a set of five EXOR gates 224-226, each of which also receives from a conductor of a conductor set 234 information relating to the identity of the particular integrated circuit 10 within which the circuits are formed. This identity information is hard-wired in the circuitry of the chip. Gates 224-226 compare the chip address information temporarily stored in register 106 with the stored identity to produce a logic high signal set for application to the inputs of an AND gate 228 when a match occurs. AND gate 228 responds to an all-ones data set from gates 224-226 to produce a logic high level representative of a match between the chip identity and the incoming chip address. The logic high level representative of a chip address match is applied to the D input of FF 230.

Figure 16:
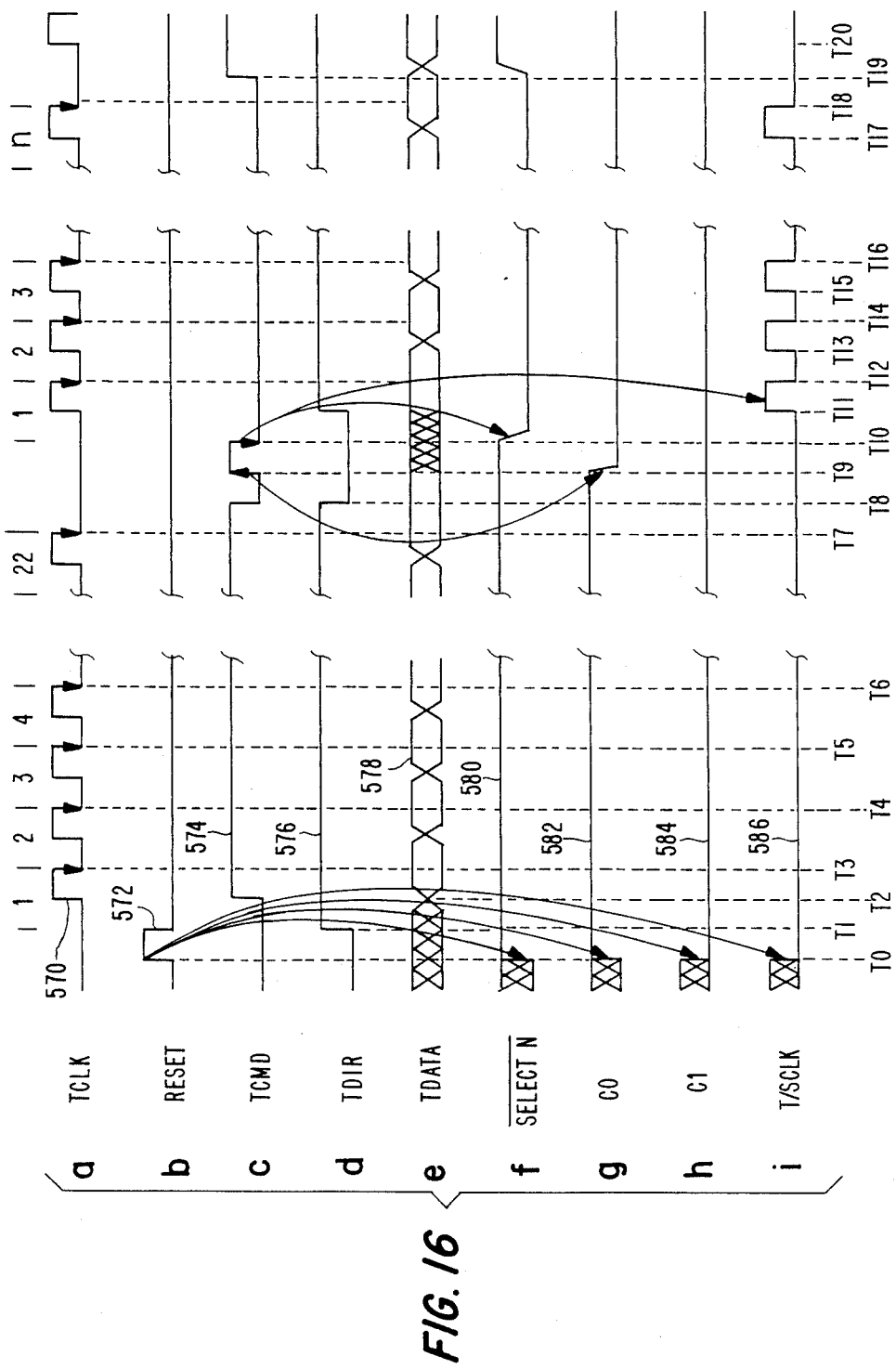
FIGS. 16a–16i illustrate various voltage or current amplitude-time waveforms occurring in the arrangement of FIG. 4 during loading of the command register of FIG. 6 with typical commands (left portion of the FIGS.), and during loading of the test register with typical test information (right portion of the FIGS.)

At the negative-going transition of the TCMD signal applied to TCMD pad 51 concurrent with a logic high level on TDIR pad 52, which occurs for example at time T8 as illustrated by waveform 574 of FIG. 16, FF 230 (FIG. 6) is loaded with the output of AND gate 228 and, when an address match occurs, produces at its Q bar output a logic low signal which is applied over a conductor 146 to the latch Q-not (LATQN) input of input-output controller 102 of FIG. 5, and which is also applied to an input of a NOR gate 232 together with the TCMD signal. NOR gate 232 produces a logic high MATCH signal on conductor 150, which is applied to NAND gate 180 of FIG. 5 and to a NAND gate 400 of FIG. 8. Thereafter, so long as the TCMD signal does not make another transition, the match signal on conductor 150 remains at a logic high level.

After time T8 as illustrated in FIG. 16, the TCMD signal is at a logic low level (except for a particular pulse described below) and as a result no further CMDCLK signals are applied by way of conductor 136 (FIG. 6) to the stages of command register 106 for clocking test information into input the command register. The command register, therefore, holds the data until a system reset, power up, or until it is reloaded.

As mentioned, stages 206-213 of command register 106 are loaded with 8 bits of information relating to the number of test clock cycles through which the signal processing block or macrocell being exercised will be cycled. Up to 254 cycles may be set in this fashion. If stages 206-213 are loaded with an all-ones (1111111), this function is bypassed so that the number of test cycles is established by the number of test cycles applied to TCLK port 54. The information relating to the number of cycles is coupled from the Q outputs of stages 206-213 of command register 106 over a conductor set 152 to preload the stages of an 8-bit down-counter 373 (FIG. 8).

Stages 214, 215, 216, and 217 of command register 106 of FIG. 6 are loaded with command information, which is applied to a logic circuit 243. The output signal of logic circuit 243, together with the outputs of stages 215, 216 and 217 of command register 106 is applied by way of a conductor set 107 to stages 248, 250, 252 and 254 of a latch 110.

Reference to FIG. 15a shows that each of the NORMAL, FREEZE, WRITE and TEST system operating modes has two subsets, the first being ALL and the second being INDIVIDUAL, which are selectable by different command (CMD) codes. The INDIVIDUAL mode causes the command to be executed for only one identified test register and its associated macrocell, while the ALL subset executes the commands for at least one of the test registers of all of the macrocells. The READ mode cannot, in general, be accomplished for all the test registers simultaneously, since the data stored therein is expected to be different from one to the next. Consequently, READ ALL is meaningless. An attempt to use a READ (ALL) code of 0010 is detected and acted upon as though it were a 1010 READ INDIVIDUAL code.

Logic circuit 243 includes a NAND gate 244 connected to the Q bar outputs of stages 214, 215, and 217, and to the Q output of stage 216, for responding with a logic low level to the command word 0010. The output of gate 244 is applied to an input of a further NAND gate 246, together with the Q bar output of stage 214, thereby producing at the output of logic 243 for application to the D input of stage 248 of latch 110 a logic low level for all commands stored in stages 214-217 of command register 106 other than 0010.

As mentioned in conjunction with FIG. 5, the CBITLATCH signal on conductor 138 (lower left of FIG. 6) is generated as a result of a logic high level on TCMD pad 51 (FIG. 5) together with a logic low level on TDIR pad 52, in the presence of a match signal on conductor 150. The CBITLATCH signal on conductor 138 (FIG. 6) is applied simultaneously to the clock (CK) input terminals of flip-flops 238-254 for latching the command from stages 214-217 of command register 106. The Q output of latch stage FF 254 is coupled to a conductor $96^0$ of a conductor set 96 as the CMD 0 output. The Q and Q bar outputs of FF 252 are coupled to conductors $96^1$ and $96^2$ of conductor set 96 as the CMD 1 and CMD 1N (the N suffix means NEGATIVE) signals. Similarly, the Q output of FF 250 is coupled to conductor $96^3$ of conductor set 96 as CMD 2, and the Q bar output of FF 248 is coupled as CMD 3N to conductor $96^4$ of conductor set 96. Conductor set 96 couples the CMD signals to the address decoder of FIG. 7.

As mentioned, the last five FF stages 218-222 of command register 106 (FIG. 6) are loaded with the address of the particular signal processing block (FIG. 3) to which the test is directed, or are loaded with a signal indicating that all blocks are to be tested simultaneously. By setting the first bit in the command (CMD) field low, all macrocells may be selected simultaneously. Otherwise, only the addressed registers may be selected. As mentioned, the signal processing block may be a macrocell or other logic block but is described as a macrocell herein. The Q output signals of FF 218-222 of command register 106 ar coupled over a conductor set 109 to the inputs of FF 256, 258, 260 and 262 of latch 110. The macrocell address information is latched into FF 256-262 by the CBITLATCH received at their CK inputs by way of conductor 138. The Q output of FF 262 is coupled as a macrocell address (MADDR) 0 signal to a conductor 98$^0$ of a conductor set 98. Conductor set 98 carries a plurality of signals which together identify the particular test register which is to be acted upon. The Q output of FF 260 is coupled as a MADDR 1 signal to conductor 98$^1$ of conductor set 98. Similarly, the Q outputs of FF 258 and 256, respectively, are coupled as MADDR 3 and 4, respectively, appearing on conductors 98$^3$ and 98$^4$ of conductor set 98. Other MADDR addresses may be taken from the Q bar outputs of the stages 256-262 and designated by the suffix N (negative). Conductor set 98 couples the MADDR signals to the address decoder of FIG. 7.

In FIG. 7, a D type flip-flop 264 at upper right has its D terminal connected to receiving a V$_{DD}$ voltage representing a logic high level. The reset (R) input terminal of FF 264 is coupled to the output of a NOR gate 266 which receives TCMD from TCMD pad 51 (FIG. 5) by way of conductor 94. NOR gate 266 also receives at another input the DASPRESET signal by way of an inverter 270 from conductor 242 and NOR gate 240 (FIG. 6). The inverted DASPRESET signal is at a logic high level throughout the interval T1-T20 illustrated in FIG. 16. This logic high level disables NOR gate 266. Consequently, TCMD changes at time T8 cannot affect the signal applied to the R input of FF 264. FF 264 is reset at time T0 (FIG. 16) by the negative-going transition at the output of inverter 270 coupled through NOR gate 266. In the reset condition, the Q bar output of FF 264 assumes the logic high level, which is applied to a conductor 399 by way of one of several drive amplifiers, each designated 299. Output OR gaes 309, 310, 311 and 312 of an address decoder 362 each have an input coupled to conductor 399, as do OR gates 321-324 of an address decoder 364, and OR gates 333-336, 346-349 and 358-361 of address decoders 366, 368 and 370, respectively. The outputs of these OR gates are the individual SELECT outputs of their respective address decoders. In particular, the output of OR gate 309 is the SELECT 0 output of address decoder 362, the output of OR gate 310 is the SELECT 1 output of address decoder 362, and the outputs of OR gates 311 and 312 are the outputs, respectively, of address decoder 362. Similarly, the outputs of OR gates 321, 322, 323 and 324 are the SELECT four, five, six and seven outputs of address decoder 364. The remaining output SELECT lines are identified in FIG. 7 and are not set out at length. Particular ones of the SELECT outputs may be denominated select M 73 or select N 74 (FIG. 4) where any arbitrary SELECT output is meant. The SELECT conductors are routed from command and address decoder 120 over appropriate portions of test bus 72 (FIG. 4) to the TRMs which they address.

The SELECT output lines which are selected are set to a logic high level beginning at time T0 as illustrated by the SELECT N in FIG. 16. This results in selecting all possible TRMs, including the Mth TRM. At time T10 as illustrated in FIG. 16, the TCMD signal generated by the external test apparatus makes a negative-going transition, with TDIR in a logic low state. If there is a chip address match as described in conjunction with FIG. 6, CBITLATCH signal on conductor 138 (FIG. 7) is generated, which is applied by way of driver 268 (FIG. 7) to the CK input of FF 264, thereby latching a logic low level to the Q output of FF 264 and conductor 399. This removes the logic high SELECT signal from all of the SELECT output conductors except those specifically being addressed.

The conductor designated CMD 3N corresponds to the most significant bit of the COMMAND (CMD) bit field, listed in FIG. 15a. Thus, CMD 3N produces a "SELECT ALL"condition. As mentioned above, the SELECT ALL condition of the READ mode is converted to an individual reading.

At lower left in FIG. 7, a NOR gate 276 receives CMD 0 signal over a conductor 96$^0$ and CMD IN over conductor 96$^2$ from conductor set 96, and responds by producing the CONTROL 1 signal on a conductor 118. Conductor 116 is part of test bus 72 (FIGS. 3 and 4). FIG. 15a lists the state of the control 1 (C1) signal for all possible commands. NOR gate 277 of FIG. 7 has inputs connected to receive CMD 0 over conductor 96$^0$ and CMD 2 over conductor 96$^3$ from conductor set 96, and responds by producing the CONTROL 0 (C0) signal on conductor 116, which is also a part of test bus 72. The state of the C0 signal for various system operating states is illustrated in FIG. 15a. Another NOR gate 278 receives inputs CMD 0, CMD 1, and CMD 2 over conductors 96$^0$, 96$^1$ and 96$^3$ to produce on conductor 142 the LPBCKMODE signal which is applied to NAND gates 158 and 174 (FIG. 5) for responding to loopback command 0111 (FIG. 15a) which allows test of COMMAND register 106 (FIG. 6) by serially coupling the known test data loaded into the COMMAND REGISTER over conductor 130 by way of gate 182 (FIG. 5) to TDATA pad 53, where it may be verified by the external test apparatus.

Blocks 282, 290, 292, 294, 296 are portions of the logic of FIG. 7 which are laid out as macrocells in the illustrated embodiment of the invention. These macrocells, together with inverters 272, 274 and 299, and NOR gates 301 through 308, 313-320, 325-332, 337-345, and 350-357 coact as a one-of-32 selector to select one of the SELECT lines of bus 72, such as SELECT M 73 or SELECT N 74, in response to particular combinations of bits appearing on MADDR conductor set 98.

The clock control arrangement of FIG. 8 accepts system clock (SYSCLK) inputs over conductor 124 (lower left of the FIG.) and test clock (TCLKA) inputs over conductor 126, and couples one or the other to a T/SCLK output conductor 128, which is part of bus 172. It should be noted that conductor 128 has no effect on the normal operation of the signal processing blocks 24, 28, etc. of FIG. 2 or 3, but allows either the system clock to be applied to signal processing blocks while being tested or allows a test clock to be used, which may advantageously be at a different frequency than the system clock. Furthermore, a count-down number may be used to predetermine the number of test clock cycles applied to the macro under test. In FIG. 8, the cycles 0-cyles 7 signals are received over conductor set 152 and are applied individually to inputs of NOR gates $414^0$–$414^7$, respectively, of a presettable counter 373.

When COMMAND register 106 (FIG. 6) is loaded with commands, and there is a match between the hardwired chip address and the chip address in the command, a MATCH signal is applied over conductor 150 to NAND gate 400, which couples the signal through OR gate 402 to FF404. Flip-flop 404 is connected as a one-shot multivibrator which triggers on MATCH, momentarily setting its Q output HIGH. The logic HIGH on the Q output of FF404 applied to the set (S) inputs of stages $418^0$, through $418^7$ of counter 373 sets all the stages. A moment later, the CYCLES signals from bus 152 are gated through NOR gates $414^\circ$–$414^7$, and through NOR gates $416^\circ$–$416^7$ to the reset (R) inputs of counter stages 418, thereby resetting certain ones of stages 418, depending upon the values of the associated CYCLES bits. This leaves counter 373 preset with a signal determined by the CYCLES portion of the command.

An all-ones decoder 372 includes a NAND gate 378 coupled to receive cycles 0 and cycles 1 signal from conductor set 154, a second NAND gate 376 coupled to receive cycles 2, 3 and 4, and a third NAND gate 374 coupled to receive cycles 5, 6 and 7. The outputs of NAND gates 378, 376 and 374 are coupled to inputs of a NOR gate 380. The output of NOR gate 380 identifies the 255-count (11111111) which causes bypassing of the counter. The ALL-ONES signal applied to OR gate 388 forces a logic high level to be applied to OR gate 390 regardless of the input to AND gate 384 from the counter.

The POWRST signal is applied over conductor 148 at upper left of FIG. 8 to inputs of NOR gates $416^0416^7$. of counter 373 for resetting of the counter. Each of NOR gates $416^0$–$416^7$ receives at a second input terminal an output from the corresponding one of NOR gates $414^0$–$414^7$; The POWERST signal is also applied to an input of a NOR gate 412 for resetting of FF 404. The O output of FF 404 is connected by way of a delay circuit 406 and a conductor 407 to the S input of stages $418^0$ to $418^7$ of counter 373. A signal delayed by circuit 406 is inverted by an inverter 408 and applied by way of a conductor 409 to inputs of NOR gates $414^0$ through $414^7$.

Each state $418^0$ to $418^7$; of 8-stage counter 373 includes a D flip-flop in which the S input is connected to the output of delay circuit 406, and in which the R input is connected to the output of a corresponding one of NOR gates $416^0$–$416^7$; The Q bar output of each stage $418^\circ$ –$418^7$ is connected to it own D input terminal and to the CLK input terminal of the next following stage. NOR gate 430 receives TCLKA at its input by way of an inverter circuit 428 and a further NOR gate 398. The output of NOR gate 430 is coupled to the CLK input of the first-stage flip-flop $418^0$ counter 373 for coupling thereto the clock signals to be counted. The Q output of each counter stage $418^0$ through $418^7$ is connected to an input of one of a NOR gate 420, 422 or 424, and the outputs of NOR gates 420, 422 and 424 are connected to the inputs of an AND gate 426. This arrangement produces a logic low level from the output of AND gate 426 whenever a count remains in counter 373, and a logic high level when a zero count is achieved. The output of AND gate 426 is applied to the inputs of an AND gate 384 and of a NOR gate 430 for disabling OR gate 430 at the expiration of the count. Thus, test clock signals are counted until such time as no further count remains in counter 373, at which time AND gate 426 disables NOR gate 430 to prevent further counts.

The output of AND gate 426 of FIG. 8 is also applied to an input of AND gate 384 for disabling AND gate 384 at the expiration of the count for preventing the passage of further TCLKA clock from conductor 126 and NOR gate 398 to T/CLK conductor 128.

CONTROL 0 signal is applied from conductor 116 to OR gate 402 and by way of an inverter 382 to an input of AND gate 384. CONTROL 1 signal is applied from conductor 118 to an input of AND gate 384 and to an input of a NOR gate 386. NOR gate 386 also receives inverted CONTROL 0 signal from the output of inverter 382. The output of AND gate 384 is connected to the input of OR gate 388 together with the output of all-ones decoder 372. The output of NOR gate 388 is connected to the input of a further NOR gate 390. NOR gate 390 also receives an input from the output of NOR gate 386. An output of NOR gate 390 is applied to an input of an AND gate 392 together with the output of NOR gate 398. A further NAND gate 394 receives SYSCLK signal from conductor 124 and also receives an output signal from NOR gate 386. The outputs of NAND gates 392 and 394 are applied as inputs to a further NAND gate 396, the output of which is the T/CLK signal on conductor 128.

NAND gate 394 in FIG. 8 controls the application of SYSCLK to the T/SCLK conductor 128, and NAND gate 392 controls the application of TCLKA to conductor 128. In order for SYSCLK to be coupled through NAND gate 394, the output of NOR gate 386 must be a logic high, which condition only occurs if the inputs of NOR gate 386 are both logic low. This in turn requires that the control 0 signal on conductor 116 be a logic high, and the control 1 signal on conductor 118 be a logic low. By reference to FIG. 15a, it can be seen that this condition occurs only in the NORMAL ALL (SOFT RESET) condition, which is the normal operating condition, and in the NORMAL INDIVIDUAL mode.

The test clock signal TCLKA applied from conductor 126 through NOR gate 398 can only be coupled through NAND gate 392 when the output of NOR gate 390 is at a logic high level, which only occurs when the input signals to NOR gate 390 are both (two separate conditions) logic low. So long as either the CONTROL 0 or CONTROL 1 signals are logic 1 or logic high, the output of NOR gate 386 fulfills the first condition. Under conditions in which all-ones decoder 372 detects an all-ones condition, it produces a logic high level at a first input of NOR gate 388, thus fulfilling the second condition. If AND gate 384 produces a logic high output, this also fulfills the second condition. AND gate 384 can produce a logic high output only if as counter 373 has counted down to zero, the CONTROL 0 signal is logic low and the control 1 signal is logic high.

FIG. 9 is a block diagram illustrating the test register and multiplexer arrangement associated with a macrocell. In FIG. 9, a macrocell 28 is connected to receive parallel N-bit signals from a normal data path $26'$ including conductors $441'$, $441''$. . . $441^{n-1}$, $441^n$ (designated jointly as 441) and conductors $507'$, $507''$. . . $507N^{-1}$, $507^n$, (designated jointly as 507) to process the signals and to apply the processed signals to the normal data path 36'including conductors $509'$, $509''$. . . $509^{n-}$, $509^n$ and conductors $443'$, $443''443^{n-1}$, $-443^n$. Interposed between conductors 441 and 507 is an N-bit test register and multiplexer (TRM) 446. TRM 446 includes a control decoder 436 and also includes a plurality of one-bit type A TRMs designated generally 450 and including individual one-bit TRMs 450', 450''—450$^{n-1}$, *and also including a type B one-bit TRM 452. The main outputs of* 1-bit TRMs 450 and 1-bit TRM 452 are applied to input conductors 507'—507$^{n-1}$ and 507, respectively, of macrocell 28. Each one-bit TRM 450 also includes an auxiliary output associated with the main output. The auxiliary output of each TRM is connected to the input of the next to allow serial loading of test data.

An N-bit TRM 448 similar to N-bit TRM 446 includes a control decoder 438. TRM 448 also includes one-bit type A TRM's designated generally as 454, including individual type A TRMs 454', 454''—454$^{n-1}$ and a further one-bit type B TRM 456, each of which has its input coupled to one of conductors 509'—509$^n$ from an output of macrocell 28, and each of which has an output coupled to one of conductors 443'—443$^n$ of normal data path 36

Also illustrated in FIG. 9 is a portion of test bus 72 including C0 conductor 116, C1 conductor 118, T/SCLK conductor 128, system reset conductor 101 and serial data conductor 140. Also included in test bus 72 in the illustrated portion of the integrated circuit are two of the TRM selection lines produced by address decoder 112 (FIG. 4), namely select M conductor 73 and select N conductor 74. Select M conductor 73 ends at a control decoder 436, which is part of N-bit TRM 446, and select N conductor 74 ends at a control decoder 438, which is part of N-bit TRM 448. Select M conductor 73 and select N conductor 74 do not extend to other macrocells, because they individually address the particular decoders 446, 448 illustrated in FIG. 9. Other macrocells will be associated with other control decoders, which will be addressed by their own individual SELECT lines. Thus, test bus 72 always includes conductors 101, 116, 118, 128, and 140, but different portions of test bus 72 will contain different groupings of the select lines such as select M conductor 73 and select N conductor 74.

The C0 conductor 116, C1 conductor 118, T/SCLK conductor 128, reset conductor 101 and serial data conductor 140 are connected to all control decoders, including control decoders 436 and 438 illustrated in FIG. 9. Control decoders 436 and 438 respond to their individual selection lines, as for example select M line 73 for control decoder 436 and select N line 74 for control decoder 438, and when selected respond to the control signals on conductors 116 and 118 for controlling the 1-bit TRM's such as 450 or 454. Control decoder 436 produces A/$\overline{\text{A}}$(A bar, meaning a negation) signals on a conductor set 447, B/$\overline{\text{B}}$signals on a conductor set 449, and test register clock (TRCLK) signals on a conductor 479 for control of both type A and B TRMs, TSC signals on a conductor 481 for control of B TRM 452, and macrocell clock (MCLK) signals on a conductor 475 for control of macrocell 28. Control decoders 436 and 438 are identical, the type A 1-bit TRM's 450 and 454 are identical, and the type B 1-bit TRM's 452 and 456 are identical. Control decoder 438 does not, however, couple the MCLK signal to macrocell 28.

Figure 10:
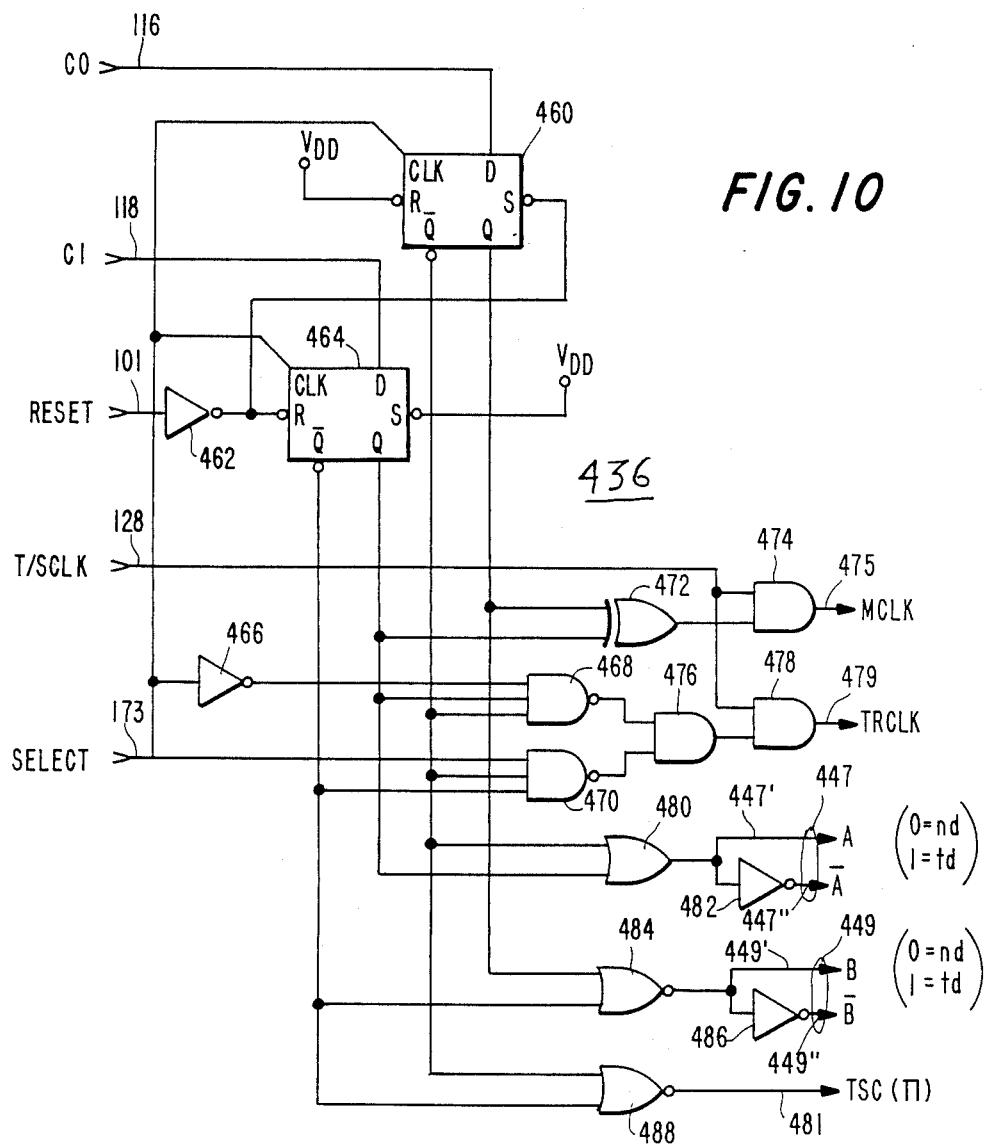
FIG. 10 is a logic diagram of a control decoder of FIG. 9.

FIG. 10 illustrates, in schematic form, details of control decoder 436 of FIG. 9. Since control decoder 438 of FIG. 9 is identical to control decoder 436, the description of FIG. 10 applies to control decoder 438 as well as to all other control decoders within N-bit TRMs of the integrated circuit. In FIG. 10, a first D-type FF 460 receives C0 control signals over conductor 116 at its D input terminal, and a second D type FF 464 receives C1 control signals over conductor 118 at its D input terminal. System reset signals are applied over conductor 101 and an inverter 462 to the R input terminal of FF 464 and the S input terminal of FF 460. SELECT input signals are applied over conductor 73 to the CLK input terminals of both FF 460 and 464. A logic high representative $V_{DD}$ signal is applied to the R input terminal of FF 460 and to the S input terminal of FF 464.

The Q output terminal of FF 460 in FIG. 10 is coupled to the input terminals of an EXOR gate 472 and a NOR gate 484. The Q bar output of FF 460 is connected to inputs of a NAND gate 468, a further NAND gate 470, an OR gate 480 and a NOR gate 488. The Q output of FF 464 is coupled to a second input of EXOR gate 472, another input of NAND gate 468, and another input of OR gate 480. The Q bar output of FF 464 is connected to a third input of NAND gate 470, and to second inputs of NOR gates 484 and 488. The T/SCLK signal on conductor 128 is applied to inputs of AND gates 474 and 478. AND gate 474 also receives an output signal from EXOR gate 472 to produce an MCLK signal on a conductor 475. The outputs of NAND gates 468 and 470 are applied to the inputs of an AND gate 476, the output of which is connected to a second input of AND gate 478 to produce on a conductor 479 at the output of gate 478 the TRCLK signal for application to each 1-bit TRM 450. The output of OR gate 480 is directly applied as the A signal to a conductor 447' of a conductor set 447, and is applied by way of an inverter 482 as the A$\overline{\text{A}}$ signal to conductor 447'' of conductor set 447. The output of NOR gate 484 is applied directly to a conductor 449' of a conductor set 449 as the B signal, and by way of an inverter 486 to a conductor 449'' of conductor set 449 to form the $\overline{\text{B}}$ signal. The output of NOR gate 448 is applied to conductor 481 as the TSC signal, for application to B type one-bit TRM 452.

Figure 11:
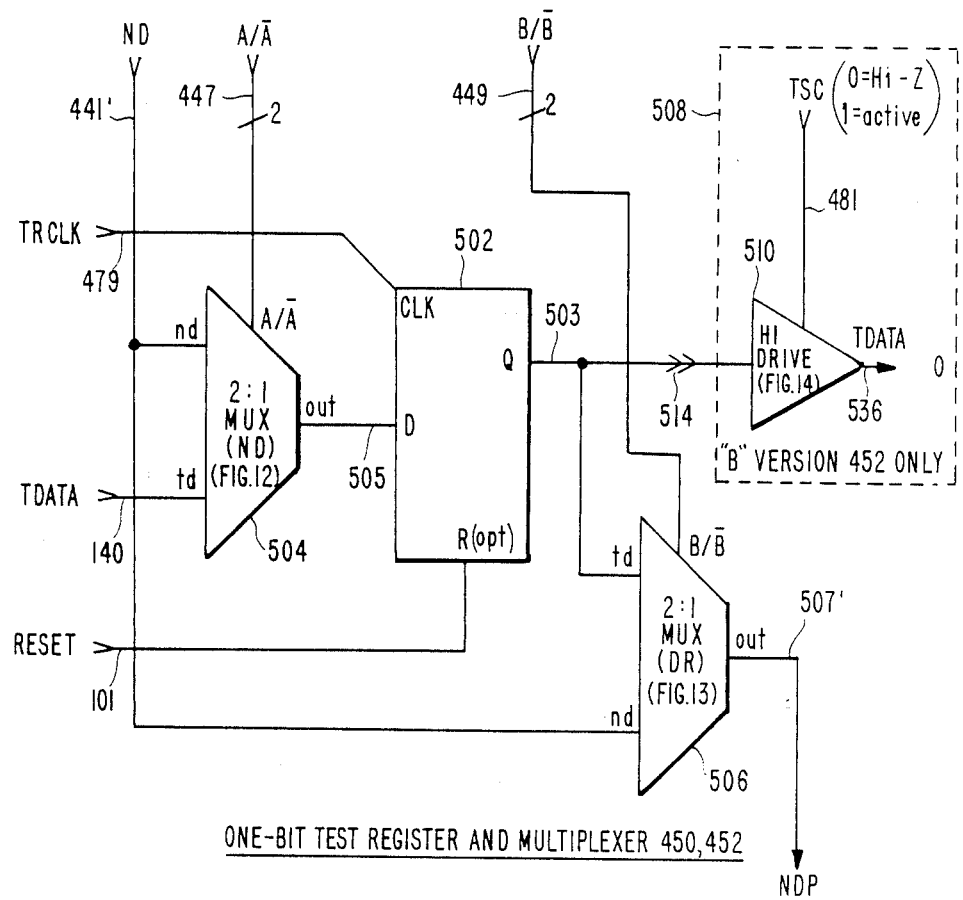
FIG. 11 is a logic diagram of one bit of a test register and its associated multiplexers of FIG. 9.

FIG. 11 includes a block diagram of a one-bit test register and multiplixer (TRM) such as 450'. The main portion of the diagram of FIG. 11 represents the A type, which is representative of TRM's 450 or 454 of FIG. 9, while a portion 508 of FIG. 11 illustrates the addition which makes the one-bit TRM into a B type representative of TRM 452 or 456 of FIG. 9.

In FIG. 11, one-bit TRM 450' receives normal data (ND) by way of conductor 441' and applies it to the nd inputs of a 2:1 multiplexer 504 and a 2:1 multiplexer 506. Multiplexer 504 also receives test data TDATA at its td input, and multiplexes the information to its output conductor 505 under the control of the A/$\overline{\text{A}}$ signal on conductor set 447, which originates from control decoder 436 of FIGS. 9 and 10. Multiplexer 504 is discussed below in conjunction with FIG. 12. The multiplexed output signal from multiplexer 504 is applied to the D input terminal of a one-bit register in the form of a D flip-flop 502. The TRCLK signal is applied to the CLK input of FF 502 by way of conductor 479, and the RESET signal is applied by way of conductor 101 to the R input of FF 502. It should be noted that the system reset is not mandatory for operation of the serial port test arrangement.

Application of the TRCLK signal latches into FF 502 (FIG. 11) whichever one of the normal data or test data signals is coupled to the D input of FF 502 by multiplexer 504 under control of the A/$\overline{\text{A}}$ signal. For example, a test data bit may be multiplexed to FF 502 and latched thereby. The latched output of FF 502 is applied from its Q output by way of a conductor 503 to the td input of multiplexer 506 and by way of a terminal illustrated as 514 to the next stage. If the next stage is a type "A"TRM, terminal 514 connects to its TDATA input terminal, so that serial test data can be clocked sequentially into the type A TRMs by clocking through each in turn. If the next stage is a type "B" TRM, described below, terminal 514 connects to HIDRIVE 510. Multiplexer 506 may couple either the latched signal or the normal data signal by way of conductor 507' to macro 28 (FIG. 9), depending upon the state of the B/$\overline{B}$ signal applied over conductor set 449 from control decoder 436 (FIG. 9). Multiplexer 506 is described further in conjunction with FIG. 13. Normal data may be coupled through multiplexer 506 to the input of the macrocell, or, in the "NORMAL" mode of operation (FIG. 15a), the normal data may be routed through multiplexer 504, register FF 502, and multiplexer 506 to the input of the macrocell, with the ability to "freeze"- the macrocell input state by ceasing clocking of register 502, or in yet another mode test data may be clocked into FF 502 by way of multiplexer 504 while the macrocell is receiving normal data by way of multiplexer 506, so that the FF output may subsequently be substituted for the normal data.

The TRM of FIG. 11 has been described in terms of its functions at the input of its associated macrocell. The same structure can be used at the output of the macrocell. For use at the output of the macrocell, normal data (ND) conductor 441' of FIG. 11 is coupled to receive normal data from the output of the macrocell, i.e., conductor 441' of FIG. 11 is connected to one of conductors 509 at the output of macrocell 28 of FIG. 9. TRM 454 (FIG. 9) has its TDATA input conductor connected to TDATA conductor 140, and all of the other output type A TRMS such as 454', 454" . . . 454$^{n-1}$ and 456 have their TDATA input conductors (FIG. 11) connected to output terminal 514 of the preceding TRM (the TRM to its left, as viewed in FIG. 9). The last TRM, which is type B TRM 456, has its output conductor 514 connected to a HIDRIVE buffer amplifier, as illustrated in FIG. 11. This allows the result of a test of macrocell 28 (FIG. 9) which is stored as a word in TRMs 454 and 456 to be read out serially by sequentially clocking through each TRM in turn and out onto TDATA conductor 140. Also, for use at the output of macrocell 28 of FIG. 9, each TRM has its normal data path (NDP) output conductor 507' (FIG. 11) connected to one of conductors 443' . . . 443$^n$ (FIG. 9).

As so far described, the arrangement of FIG. 11 corresponds to any one of the type "A" one-bit TRMs 450'-450$^{n-1}$ of FIG. 9. As mentioned, FIG. 11 also includes a portion 508, set out within broken lines, including a controllable high impedance drive (HI DRIVE) circuit 510, which is coupled to the Q output of FF502 and which is controlled by the TSC signal applied over a conductor 481. H1 DRIVE CIRCUIT 510 is a tristate driver which selectably assumes a high-impedance output state, or which drives its output conductor 536 with a noninverted or buffered replica of the signal on conductor 503. The circuit of FIG. 11 including portion 508 corresponds to a type B one-bit TRM such as 452 or 456 of FIG. 9.

FIG. 12a illustrates multiplexer 504 of FIG. 11 in symbolic form, and FIG. 12b is a schematic diagram thereof. In FIG. 12b, transmission gates 518 and 520 couple either the normal data (nd) or test data (td) signals to output conductor 505, depending upon the state of the A or $\overline{A}$ signals applied to conductors 447' or 447", respectively. FIG. 12c is a truth table of the circuit of FIG. 12b. In general, when the A input is HIGH (and the $\overline{A}$ input is therefore LOW) the data at nd input 440n is coupled to output conductor 505, and when the A input is LOW, data at td input 140 is coupled to output 505.

FIG. 13a illustrates multiplexer 506 of FIG. 11 in symbolic form, and FIG. 12b is a schematic diagram thereof. In FIG. 13b, transmission gates 524 and 526 correspond to gates 518 and 520 of FIG. 12b. In addition, the multiplexer of FIG. 13b includes an inverting stage including a P-channel FET 528 and an N-channel FET 530, having their gates coupled in common to the common outputs of gates 524 and 526. The source of FET 530 is connected to ground, and the drain of FET 528 is connected to positive voltage source $V_{DD}$. The source of FET 528 is connected to the drain of FET 530 to form an inverter signal node 531. Node 531 is coupled in common to the gates of an output P-channel FET 532 and an N-channel FET 534, connected to produce inverted signal on conductor 507. In effect, the arrangement of FIG. 13 is a high-power version of the arrangement of FIG. 12. FIG. 13c is a truth table of the arrangement of FIG. 13b.

FIG. 14a symbolically represents HI DRIVE circuit 510 of FIG. 11, and FIG. 14b is a schematic diagram thereof. The arrangement has the truth table of FIG. 14c. The complexity of the schematic arises from the need for a high-impedance output (Z of FIG. 14c) when TSC input is logic low or logic zero. FIG. 14c is a truth table for the circuit of FIG. 14b.

FIG. 15a tabulates the four-bit commands (CMD) corresponding to system operating modes, which commands may be applied from the external test apparatus by way of the TDATA pad (FIG. 5) as part of the signal which loads command register 106 (FIG. 6), which is ultimately latched in stages 248, 250, 252 and 254 of latch 110 (FIG. 6) in the event of an address match. This command signal is applied over bus 96 to logic of FIG. 7 to produce the control 0 (C0) and control 1 (C1) signals on conductors 116 and 118, respectively, for commanding the control decoders (such as 436, 438 of FIG. 9) either individually or collectively. The C0 and C1 signals corresponding to the various CMD signals are also tabulated in FIG. 15a.

FIG. 15b tabulates the system modes of operation in terms of the C0 and C1 signals, and in terms of whether or not a selection of a particular control decoder at the input or output of a macrocell has been selected.

Upon initial turn-on of the equipment, power out reset 105 of FIG. 6 generates the PWRST signal and DASPRSET signals for resetting or clearing COMMAND register 106 and counter 373. Command register 106 and latch 110 (FIG. 6) are thereby initialized to zero, corresponding in the normal operating mode. In FIG. 9, the test registers 446 and 448 are placed in a normal operating condition by the control zero (C0) and control one (C1) buses 116 and 118. Referring to FIG. 15a, the C1 signal assumes a zero level and the C0 signal assumes a logic one level. In a normal operating mode, normal data signals arriving over data path 26' (FIG. 9) pass through test register multiplexers 450 to macrocell 28, are processed and leave via conductors 509 and test register multiplexers 454 to normal data path 36".

In general, test of a particular macrocell is accomplished by (a) loading a command into the command register 106 identifying the macrocell which is to be tested and readying its input test register for loading in response to test clock, (b) at a later time applying the desired test input signal to the TDATA pad in serial form concurrently with the application of test clock to the TCLK pad, which clocks the test input data into the test register. The input data will remain in the test register until overwritten. At a later time, (c) a TEST command is written into command register 106 identifying the macrocell to be tested. The test data stored in its input test register is coupled to the macrocell input, and the test data is operated upon by the macrocell for a predetermined number of clock cycles. These clock cycles may originate from the system clock or the test clock. At each test clock pulse, the output register of the macrocell under test temporarily latches the resulting output signal of the macrocell. When clock signals end to signify the end of the test clocking in the macrocell, the output test register loaded remains loaded with a signal representing the last signal produced by macrocell clocking. The next step (d) is to load a command into the command register to read the test register associated with the macrocell under test, followed by (e) applying test direction signals to cause the output register to clock its data serially to the TDATA pad, where the external test apparatus can read it. Finally, (f) the command register commands the macrocell to return to its normal operating condition.

In operation, in order to test a particular macrocell, or to perform any other test, the command register is loaded as illustrated in the left portion of FIG. 16. A reset signal illustrated as 572 of FIG. 16b resets all the SELECT lines (72 of FIG. 4; 73, 74 of FIG. 9) to a logic high level, as illustrated in FIG. 16f at time T0. The TDIR signal is set high (576 of FIG. 16d) at a time T1, just before setting high the TCMD signal (574, FIG. 16c) at time T2. The TDIR signal is raised first in order to prevent an attempt to read the TDATA bus. The setting of TDIR and TCMD allows commands applied from the external test apparatus to the TDATA pad (578, FIG. 16e) to begin to be clocked into command register 106 (FIG. 6), at the rate of the test clock signal applied to the TCLK signal.

The loading of the command register is accomplished by applying TCLK signal to TCLK test pad 54 as illustrated in FIG. 16a for 22 clock cycles. The number of clock cycles corresponds to the number of stages in command register 106, and may be changed as desired. During this loading interval, the C0 signal is logic high (582, FIG. 16g) and the C1 and T/SCLK signals are logic low (584 of FIG. 16h and 586 of FIG. 16i, respectively). At a time illustrated as T7 of FIG. 16, the 22nd TCLK pulse 570 fully loads the command register. At time T8, both TCMD signal 574 and TDIR 576 are set logic low.

If a chip match does not occur, the command is ignored and the data sits in the command register until the next loading takes place. If a chip match occurs, the commands are latched into latch 110 of FIG. 6. The latching is accomplished by the positive going edge of a pulse applied to the TCMD input port 51 (FIG. 4), as illustrated at time T9 in FIG. 16, with the TDIR signal (576 of FIG. 16d) held low.

At time T8 (FIG. 16), the negative-going transition of TCMD signal 574 (FIG. 16c) causes address comparator 108 (FIG. 6) to produce a MATCH signal on conductor 150. Also at time T8, as illustrated in FIGS. 16c and d, the TCMD and TDIR signals are set to a logic low level, and the TCMD signal thereafter makes an excursion a logic high level at time T9, thereby in conjunction with the MATCH signal generating the CBITLATCH signal on conductor 138 (FIG. 5) for causing latch 110 (FIG. 6) to latch the commands and macrocell address signals. At time T9, command latch 110 causes generation of the C0 and C1 signals 582 and 584, respectively, on conductors 116 and 118, respectively, of FIGS. 7 and 9. They assume the states illustrated in FIG. 15a for the selected command. As illustrated in FIGS. 16g and 16h, CO signal assumes logic low level and the C1 signal remains in a logic low level.

The negative-going transition of the TCMD signal at time T10, with TDIR held at a logic low condition, resets FF264 (FIG. 7) and enables the SELECT line(s) to couple the selected one (or all) of the SELECT signals over bus 72 to the various test latch decoders, such as 436 and 488 of FIG. 9. Assuming that the command word was 0011 (WRITE ALL) or 1011 (WRITE INDIVIDUAL), the selected decoder responds by setting all the multiplexers associated with the selected Test Register and Multiplexers (TRM) 450 (FIG. 9) to connect the multiplexers for serially receiving the serial test data.

The negative-going lagging edge of the pulse in the TCMD signal at time T10 also causes presetting of counter 373 (FIG. 8). This in turn enables the logic in the lower portion of FIG. 8 to allow either test or system clock to be applied through bus 72 to the test registers.

Beginning at time T11 as illustrated in FIG. 10, the TDIR signal goes HIGH and TCLK signal 590 (FIG. 16a) is coupled through the logic of FIG. 8 to produce the T/SCLK clock signal.

During the interval T11–T18 of FIG. 16, test data applied to the TDATA pad is clocked into the selected test register. At time T18, the test data has been clocked into the test register. This completes a first command cycle with the command WRITE (ALL or INDIVIDUAL), in which the selected macrocell input test register is loaded with data upon which the test is to be executed.

The test of an individual macrocell is continued by loading another command into the command register, namely the TEST INDIVIDUAL command (CMD=1110), which results in C0=0, C1=1. In this mode, the previously selected macrocell has its inputs connected to its input test register for receiving the previously loaded data. Also, the TCLK input signal is coupled onto the T/SCLK line. The TEST INDIVIDUAL mode continues for the number of clock cycles preset into the CYCLES field of the command register. If down-counter 373 (FIG. 8) has been bypassed, then the T/SCLK line (128 of FIG. 8) remains under control of the TCLK pad until a new command is entered into the command register.

During the test of each macrocell, the output test register latches the output state at each clock cycle. The output state remains latched after the last test clock cycle.

Figure 17:
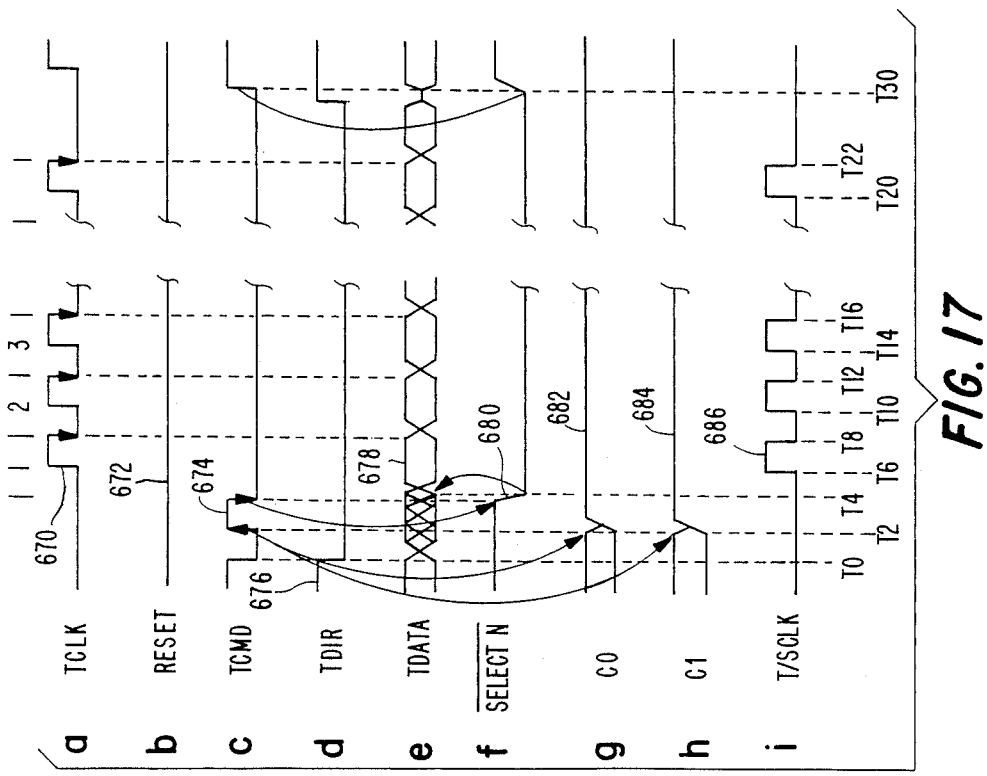
FIGS. 17a–17i illustrate various voltage or current amplitude-time waveforms occurring in the arrangement of FIG. 4 during typical reading of the test register of FIG. 9.

Once the results of the test of the individual macrocell is loaded into the output test register (454 of FIG. 9), reading is accomplished by the READ mode. For this mode, the COMMAND register must be loaded with a READ command, 1010 or 0010 (see FIG. 15a), which results in C0=1, C1=1. As illustrated in FIG. 17, the TCMD signal 674 of FIG. 17c makes a positive-going transition at time T2 with TDIR (676, FIG. 17d)

held low, thereby latching the command and resulting in generation of C0=1 and C1=1, as illustrated by 682 and 684 of FIGS. 17g and h. No reset (672 of FIG. 17b) is required. TCMD signal 674 makes a negative-going transition at time T4, thereby producing the desired select N output (680 of FIG. 17f). The test clock signal applied to TCLK pad 54 (FIG. 4) is coupled through to the T/SCLK line (686 of FIG. 17i) to serially clock data (678 of FIG. 17e) from the selected output test register to the external test apparatus by way of TDATA pad 53. Thus, a complete test cycle of a macrocell is accomplished by a WRITE cycle, a TEST cycle and a READ INDIVIDUAL cycle.

In order to resume normal operation, the NORMOP (INDIVIDUAL or ALL) mode is then commanded. In the normal operation, all (NORMOP ALL) mode, which is a test system reset or soft reset mode, the command field is 0000, C0=1 and C1=0. The system clock SYSCLK on conductor 124 of FIG. 8 is coupled to the T/SCLK line 128, and all macrocell test registers 446, 448 are addressed or selected. During the NORMOP ALL mode the state of the normal data path (26', 36" of FIG. 9) continues to be momentarily captured by the test registers on each negative-going clock pulse. The state momentarily stored on one clock cycle is overwritten during the next clock cycle. This allows taking a "snapshot" of the logic states within the chip at any predetermined moment, by preventing overwrite of the test register after it has latched the desired state.

In the normal operation individual (NORMOP INDV) mode, the command field is 1000 and the corresponding control bits are C0=1, C1=0. In this mode, system clock SYSCLK is connected to the T/SCLK line, and only one macrocell test register is selected or addressed. This mode is used to place a particular macrocell back into normal operation while the remainder of the chip remains frozen, executing a test, or in some other combination of modes.

Figure 18:
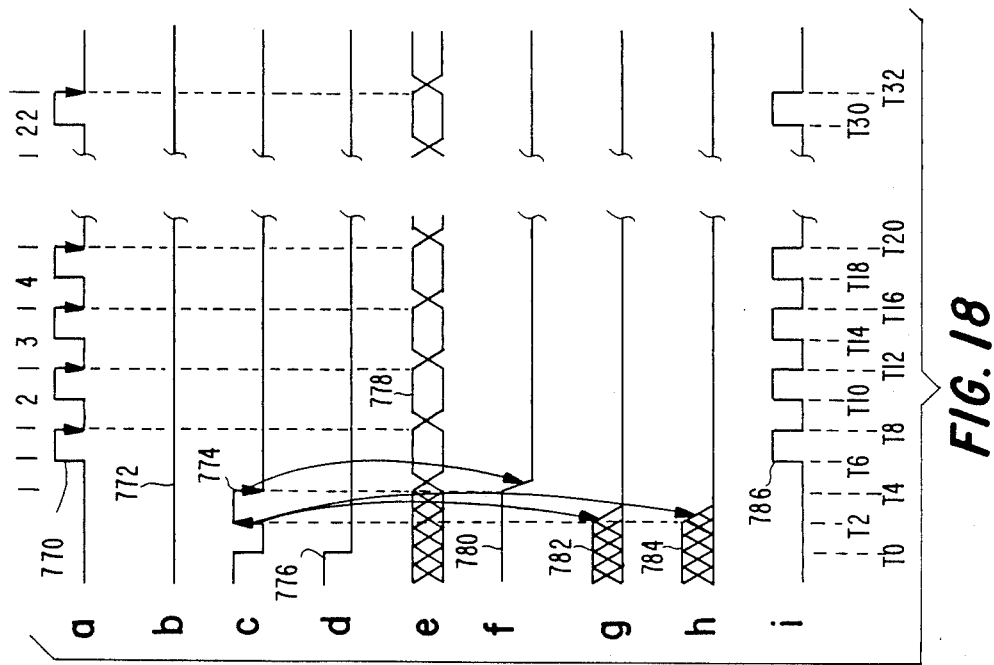
FIGS. 18a–18i illustrate various voltage or current amplitude-time waveforms occurring in the arrangement of FIG. 4 during typical reading of the command register in the LOOPBACK mode.

FIG. 18 illustrates reading of the command register, assuming the command register was previously loaded with a loopback command (CMD=0111). At time T2, TCMD (774, FIG. 18c) makes a positive-going transition with TDIR (776, FIG. 18d) held logic low, resulting in latching of the command and generation of C0=0 (782, FIG. 18g) and C1=0 (784, FIG. 18h) which freezes all test registers. At time T4, TCMD signal 774 makes a negative-going transition, resulting in generation of a SELECT N signal (780, FIG. 18f). The TCLK pad is coupled to the T/SCLK line. The data in the command register is then serially coupled to the TDATA pad for examination by the external test apparatus.

If the system under test includes many chips, it may be desirable to preserve the operating states of chips which are not currently being tested. This is accomplished by the FREEZE ALL mode, with command field 0001 and C0=0, C1=0. This shuts down all the test register and macrocell clocks, resulting in a frozen or waiting state.

The FREEZE INDV (individual) mode uses command field 1001 and C0=0, C1=0. This freezes a selected macrocell test register. This may be used to freeze the output test register of a macrocell being tested, for later reading. During the FREEZE INDV mode, the test clock applied to TCLK pad is connected to the T/SCLK line.

The WRITE ALL mode uses command field 0011, corresponding to C0=0, C1=0. In this mode, the same data is clocked into all macrocell test registers, in which it remains until the test registers are again selected, either individually or collectively, and new data is overwritten therein. During the WRITE ALL mode the TCLK is connected to the T/SCLK line.

The WRITE INDV mode is selected by command field 1011, corresponding to C0=0, C1=0. In this mode, data can be written into a selected test register via the TDATA pad, where it remains until overwritten. The TCLK pad is connected to the T/SCLK line.

In the TEST ALL mode (command field 0110, C0=0, C1-1), every macrocell executes a test using data from its own input test register. The TCLK pad is connected to the T/SCLK line, and test clock applied to the TCLK pad is coupled to T/SCLK for the number of clock cycles programmed into the CYCLES field. If the down-counter (373 of FIG. 8) is bypassed, the T/SCLK line is under the direct control of the TCLK pad until a new command is entered into the command register (106 of FIG. 6).

The TEST INDV mode (command 1110, C0=0, C1=1) executes a test in a selected macrocell using data stored in its own input test register. During this mode the TCLK pad is connected to the T/SCLK line. The TEST INDV mode continues for the number of clock cycles preset in the CYCLES field of the command. If the down-counter has been bypassed, the T/SCLK line is under the direct control of test clock applied to the TCLK pad.

Other embodiments of the invention will be apparent to those skilled in the art. For example, the order and the number of bits of the test data stored in command register 106 (FIG. 6) may be different from that shown. More or fewer test cycles than 254 may be commanded by an appropriate change in the number of bits. While positive logic has been described, negative logic could be used for all or a part of the system, so long as the logic circuits were rearranged to suit. The arrangement of FIG. 2 illustrates a single input signal processing block, and two each of the intermediate and output signal processing blocks, but many more of each kind of signal processing block may be used in the integrated circuit. In general, the more signal processing blocks there are, the more difficult ordinary methods of test become, and the more advantageous the inventive arrangement. As to any particular signal processing block within the integrated circuit, all preceding processing may be considered to be a single processing block, and all subsequent processing may be considered to be another single processing block.

What is claimed is:

1. A monolithic semiconductor integrated circuit having a plurality of functional blocks for processing signals and adapted for receipt of test signals from a test apparatus external to said integrated circuit and also adapted for return of test signals thereto for, in at least one type of operation, controllably testing one or more of said functional blocks without affecting others of said functional blocks, and for returning the results of said test to said test apparatus, said integrated circuit comprising:

plural input pads adapted to be coupled to circuits external to said semiconductor integrated circuit for receiving normal operation signals therefrom;
  at least one logic circuit coupled to said plural input pads, said logic circuit including at least input, intermediate and output signal processing blocks, each of said input, intermediate and output signal processing blocks including at least input terminals and output terminals, said logic circuit also including first and second coupling means, said logic circuit and coupling means being adapted for receiving said normal operating signals and for processing said normal operating signals in said input signal processing block to generate first processed signals, for controllably coupling said first processed signals to said input terminals of said intermediate signal processing block for generation in said intermediate signal processing block of second processed signals, and for controllable coupling said second processed signals to said input terminals of said output signal processing block for producing output processed signals at said output terminals of said output signal processing block;

plural output pads coupled to said output signal processing block for receiving said output processed signals, said plural output pads being adapted to be coupled to utilization apparatus external to said semiconductor integrated circuit;

a set of four additional pads adapted to be coupled to said test apparatus external to said semiconductor integrated circuit for, at least in part, performing individual tests upon at least a portion of said intermediate signal processing block, said four additional pads being (a) a test data pad controllably adapted for receiving serial test information from said test apparatus in a write mode of operation and for transmitting serial response data to said test apparatus in a read mode of operation, said serial test information including address information and at least one of command data and test data;

(b) a test data direction pad adapted for receiving a test data direction signal from said test apparatus for establishing the direction of data flow through said test data pad;

(c) a test clock pad for receiving test clock signals from said test apparatus;

(d) a test command pad for receiving test command signals from said test apparatus;

wherein said first coupling means further comprises (a) a first controllable test register including at least serial input and parallel output terminals;

(b) first controllable multiplexing means including control terminals, said first multiplexing means being coupled to said output terminals of said input signal processing block, to said input terminals of said intermediate signal processing block, and to said first test register, for, in a normal mode of operation, coupling said first processed signals to said input terminals of said intermediate signal processing block, and in said write mode of operation coupling said serial input terminal of said first test register to said test data pad whereby said first test register may be loaded with serial test data, and in a test mode of operation coupling said parallel output terminals of said first test register to said input terminals of said intermediate signal processing block whereby said first test register may be unloaded to said intermediate signal processing block for processing said test data for producing processed test data at said output terminals of said intermediate signal processing block;

and wherein said second coupling means further comprises:

(a) a second controllable test register including at least serial output and parallel input terminals;

(b) second controllable multiplexing means including control terminals, said second multiplexing means being coupled to said output terminals of said intermediate signal processing block, to said input terminals of said output signal processing block, and to said second test register, for, in said normal mode of operation, coupling said second processed signals to said input terminals of said output signal processing block, and for, in said test mode of operation, coupling said parallel input terminals of said second test register to said output terminals of said intermediate signal processing block, whereby said second test register may be loaded with said processed test data from said output terminals of said intermediate signal processing block, and for, in said read mode of operation, connecting said serial output terminal of said second test register to said test data pad, whereby said processed test data is available at said test data pad; and control means coupled to said test command pad, to said test data direction pad, and test data pad, and to said first and second controllable test registers, and to said first and second controllable multiplexing means, for selectively assuming said normal, said write, said test and said read modes of operation for thereby testing said intermediate signal processing block.

2. A circuit according to claim 1 wherein said control means further comprises:

a command register adapted to be serially loaded with test information;

command register coupling means coupled to said test data direction, test command, test clock and test data pads for, under control of particular logic levels applied from said external test apparatus to said test command and test data pads, causing said command register to be serially loaded in response to test clock signals applied to said test clock pad.

3. A circuit according to claim 2 wherein said control means further comprises:

a nonvolatile memory arrangement loaded with an identification number identifying the particular semiconductor integrated circuit;

comparison means coupled to a portion of said command register and to said nonvolatile memory arrangement for comparing a chip address word temporarily stored in said command register with said identification number for generating a latch enable signal; and at least one latch coupled to said command register and to said comparison means for, in response to said latch enable signal, latching at least a portion of the contents of said command register other than said chip address word.

4. A circuit according to claim 3 wherein said one latch latches a command signal representative of the desired one of said normal, load, test and read modes of operation.

5. A circuit according to claim 4 further comprising a second latch coupled to said command register and to said comparison means for, in response to said latch enable signal, latching a signal processing block address word representative of the particular one of said intermediate signal processing blocks for which the command is intended.

6. A circuit according to claim 1 further comprising start-up reset means for resetting said control means to select said normal mode of operation upon initial turn-on of said integrated circuit.

7. A circuit according to claim 1 wherein said control means comprises presettable counting means coupled to said test clock pad for, in response to selection of at least one mode of operation, coupling to said first and second test registers only a predetermined number of test clock pulses applied to said test clock pad from said external test apparatus.

* * * * *